United States Patent [19]
Matsuno et al.

[11] Patent Number: 5,397,400
[45] Date of Patent: Mar. 14, 1995

[54] THIN-FILM SOLAR CELL

[75] Inventors: Yoshinori Matsuno; Hideo Naomoto; Satoshi Arimoto; Hiroaki Morikawa; Hajime Sasaki, all of Itami, Japan

[73] Assignee: Mitsubishi Denki Kabushiki Kaisha, Tokyo, Japan

[21] Appl. No.: 94,304

[22] Filed: Jul. 21, 1993

[30] Foreign Application Priority Data

Jul. 22, 1992 [JP] Japan .................................. 4-217237
Feb. 23, 1993 [JP] Japan .................................. 5-032351

[51] Int. Cl.$^6$ ............................................ H01L 31/06
[52] U.S. Cl. ...................... 136/256; 136/259; 136/262; 257/436; 257/466
[58] Field of Search .............. 136/256, 262, 259; 257/436–437, 466; 437/3

[56] References Cited

U.S. PATENT DOCUMENTS

| | | | |
|---|---|---|---|
| 4,239,810 | 12/1980 | Alameddine et al. | 427/75 |
| 4,416,053 | 11/1983 | Figueroa et al. | 437/3 |
| 4,498,225 | 2/1985 | Gutierrez et al. | 437/3 |
| 4,773,945 | 9/1988 | Woolf et al. | 136/256 |

FOREIGN PATENT DOCUMENTS

| | | | |
|---|---|---|---|
| 57-85270 | 5/1982 | Japan | 136/256 |
| 63-5576 | 1/1988 | Japan | 136/256 |
| 63-196082 | 8/1988 | Japan | 437/2 |
| 2-49474 | 2/1990 | Japan | 437/2 |
| 2-244681 | 9/1990 | Japan | 136/256 |
| 3-97274 | 4/1991 | Japan | 437/2 |
| 4-91482 | 3/1992 | Japan | 437/2 |
| WO86-05923 | 10/1986 | WIPO | 136/256 |

OTHER PUBLICATIONS

Kida et al, "Large-Area, Thin-Substrate Polycrystalline Si Solar Cells Using Surface Passivation Technology", Technical Digest of the International PVSEC-5, 1990, pp. 943–946.

*Primary Examiner*—Aaron Weisstuch
*Attorney, Agent, or Firm*—Leydig, Voit & Mayer

[57] ABSTRACT

A thin-film solar cell includes a thin active layer of high purity material having opposed front and rear surfaces for light-to-electricity conversion, a structure for supporting the thin active layer, and a rear electrode in contact with the rear surface of the active layer. The supporting structure includes a supporting substrate of a low purity material having opposed front and rear surfaces, on the front surface of which the rear surface of the active layer is disposed, and an insulating barrier layer interposed between the front surface of the supporting substrate and the rear surface of the active layer. The barrier layer prevents impurities in the supporting substrate from diffusing into the active layer. Since the supporting substrate comprises a low purity material, the quantity of the expensive high purity material can be reduced by reducing the thickness of the active layer, resulting in low production costs. Since the supporting substrate is present on the rear surface of the active layer, a surface electrode disposed on the front surface of the active layer is exposed. Therefore, when a solar cell module is fabricated using a plurality of the solar cells, a wire bonding process for connecting adjacent solar cells is easily carried out.

9 Claims, 31 Drawing Sheets

THIN-FILM SOLAR CELL

FIELD OF THE INVENTION

The present invention relates to thin-film solar cells and methods for producing the thin-film solar cells and, more particularly, to structures for supporting a thin active layer and process steps for producing the structures.

The present invention relates to process steps for forming an anti-reflection film in the method for producing a thin-film solar cell.

The present invention relates to etching methods and automatic etching apparatus and, more particularly, to methods and apparatus for controlling the etching depth when a material, such as a semiconductor wafer, is etched with a prescribed etchant.

The present invention relates to methods for producing semiconductor devices and, more particularly, to methods for selectively etching a substrate of the thin-film solar cell or the like from the rear surface to form a aperture.

BACKGROUND OF THE INVENTION

In recent years, technologies relating to thin-film solar cells have been advanced to realize inexpensive and light-weight solar cells and, therefore, thinner solar cells manufactured with less material have been demanded. In addition, such thin-film solar cells are demanded for scientific reasons, and the influence on the characteristics of a solar cell due to a reduction in thickness are of interest.

Disclosed in "Technical Digest of the International PVSEC-5, Kyoto, Japan, 1990" pp. 943-946 is a thin-film solar cell in which portions of an active layer are selectively etched away from the rear surface leaving portions serving as a honeycomb reinforcing structure.

FIGS. 26(a) and 26(b) are plan views for explaining a prior art thin-film solar cell, in which FIG. 26(a) illustrates a solar cell module and FIG. 26(b) illustrates a thin-film solar cell included in the solar cell module. In the figures, the solar cell module 200a includes a plurality of thin-film solar cells 200 arranged in a matrix on a substrate 200b. Each of the thin-film solar cells has comb-shaped surface electrodes 10a and 10b on the front surface and a rear electrode 20 on the rear surface. In the solar cell module 200a, a plurality of solar cells 200 are connected in series so that the surface electrodes 10a and 10b of each solar cell are connected to the rear electrode of the adjacent solar cell using a wire 11.

The comb-shaped surface electrode 10a (10b) comprises a common bus electrode $10a_1$ ($10b_1$) and a plurality of grid electrodes $10a_2$ ($10b_2$) protruding from opposite sides of the bus electrode. The bus electrodes $10a_1$ and $10b_1$ are parallel to each other. In operation, photocurrent generated on the surface of the thin-film solar cell 200 is collected by the grid electrodes $10a_2$ and $10b_2$ and transferred to the respective bus electrodes $10a_1$ and $10b_1$.

FIG. 29(e) illustrates a cross-sectional view of the thin-film solar cell 200 taken along line 29e—29e of FIG. 26(b). In FIG. 29(e), reference numeral 201 designates a p type monocrystalline silicon (Si) substrate about 150 μm thick. An n type region 202 is disposed within the surface region of the p type monocrystalline Si substrate 201, producing a p-n junction. That is, the substrate 201 serves as an active region performing light-to-electricity conversion in the vicinity of the p-n junction. The comb-shaped surface electrodes 10a and 10b are disposed on prescribed portions of the n type region 202 spaced apart from each other. An anti-reflection film (hereinafter referred to as AR film) 225 comprising a lower SiN film 204a and an upper $SiO_2$ film 223 is disposed on the surface of the n type region 202 where the surface electrodes 10a and 10b are absent. The AR film 225 confines incident light in the active layer.

The Si substrate (active region) 201 has a honeycomb reinforcing structure 210 on the rear surface, and the reinforcing structure 210 improves the mechanical strength of the thin Si substrate 201. The height of the reinforcing structure 210 is about 150 μm.

A rear electrode 206 is disposed on a part of the rear surface of the Si substrate 201 parallel to the surface electrodes 10a and 10b. A $p^+$ type BSF (Back Surface Field) region 203 is disposed within the Si substrate 201 contacting the rear electrode 206. The $p^+$ type BSF region 203 produces an energy barrier against minority photocarriers (electrons) in the vicinity of the rear electrode 206. The energy barrier prevents the photocarriers from reaching the interface between the substrate 201 and the rear electrode 206, whereby disappearance of photocarriers at the interface is avoided and the photocarriers generated at the interface are accelerated toward the surface electrodes.

A method for manufacturing the thin-film solar cell is illustrated in FIGS. 27(a)–27(d), 28(a)–28(c), and 29(a)–29(e).

Initially, an acid-proof photoresist 221 is patterned on the opposite front and rear surfaces of the Si substrate 201, on which an oxide film (not shown) is produced, except for a prescribed region on the rear surface of the substrate, preferably using a screen printer (FIG. 27(a)). In the figure, the acid-proof photoresist pattern on the front surface of the substrate is omitted. After drying the acid-proof photoresist pattern 221, the Si substrate 201 is etched from the rear surface using the acid-proof photoresist pattern 221 as a mask, whereby the Si substrate 201 is thinned leaving the honeycomb reinforcing structure 210 (FIG. 27(b)). A mixture of hydrofluoric acid and nitric acid is employed as an etchant. The patterning of the acid-proof photoresist may be carried out by a conventional photolithographic process.

After removing the photoresist pattern 221, phosphorus is diffused into the Si substrate 201 from the front and rear surfaces using $POCl_3$ (phosphorus oxychloride), forming n type regions 202a and 202b. A p-n junction is produced at the interface between the p type Si substrate 201 and each of the n type regions 202a and 202b (FIG. 27(c)).

The front surface n type region 202a is covered with an acid-proof photoresist 222, and the rear surface n type region 202b is etched away using hydrofluoric acid. Thereafter, Al paste 230 is selectively screen-printed on a center part of the rear surface of the substrate 201, and an annealing is carried out at 600° ~ 800° C. to diffuse Al into the Si substrate, forming a p type high impurity concentration region, i.e., the $p^+$ type BSF region 203 (FIG. 27(d)).

After removing the acid-proof photoresist 222 from the front surface of the Si substrate 201, $SiO_2$ and $TiO_2$ are successively deposited on the surface by LPCVD (Low Pressure Chemical Vapor Deposition), forming an AR layer 204 having a two-film structure (FIG. 28(a)). Then, surface electrodes 10a and 10b are formed by firing an Ag paste. More specifically, Ag paste 10 is selectively screen-printed on prescribed portions of the AR film 204 (FIG. 28(b)). When the Ag paste 10 is baked, the Ag paste penetrates through the AR layer 204 comprising the SiO$_2$ film and the TiO$_2$ film and reaches the n type region 202, resulting in the surface electrodes 10a and 10b electrically in contact with the n type region 202 (FIG. 28(c)).

Finally, Ag paste is screen-printed on a part of the rear surface of the substrate opposite the BSF region 203 and it is baked to form the rear electrode 206 (FIG. 28(c)).

While in the above-described process steps of FIGS. 28(a)-28(c) the AR layer 204 comprises the SiO$_2$ film and the TiO$_2$ film, the AR layer may comprise an SiN film. FIGS. 29(a)-29(e) illustrate process steps employing the SiN AR layer.

After forming the BSF region 203 as shown in FIG. 27(d), SiN is deposited on the n type region 202 by plasma CVD, forming an AR layer 204a (FIG. 29(a)).

Thereafter, an SiO$_2$ film 223 is deposited on the SiN AR layer 204a by LPCVD, and an acid-proof photoresist 224 is screen-printed on the opposite front and rear surfaces of the Si substrate 201 except a prescribed region of the front surface (FIG. 29(b)). In the figure, the acid-proof photoresist on the rear surface is omitted. After drying the acid-proof photoresist 224, the SiO$_2$ film 223 is selectively etched with hydrofluoric acid using the acid-proof photoresist 224 as a mask (FIG. 29(c)).

After removing the acid-proof photoresist 224, the SiN AR layer 204a is selectively etched with phosphoric acid using the SiO$_2$ film 223 as a mask (FIG. 29(d)).

In the step of FIG. 29(e), Ag paste is screen-printed on portions of the front surface where the n type region 202 is exposed and it is baked to form the surface electrodes 10a and 10b. Finally, Ag paste is screen-printed on a part of the rear surface of the substrate opposite the BSF region 203 and it is baked to form the rear electrode 206.

In the above-described method for producing the thin-film solar cell, however, since the monocrystalline Si substrate 201, which is a high purity material, is selectively etched from the rear surface leaving the honeycomb reinforcing structure 210, a thick monocrystalline Si substrate including the thickness of the reinforcing structure 210 is required. Although this substrate thinning process provides a light-weight solar cell, the required quantity of the monocrystalline Si cannot be reduced. Therefore, it is difficult to reduce the production cost by reducing the material cost.

While in the above-described prior art solar cell the thin Si substrate is supported by the honeycomb reinforcing structure formed on the rear surface of the substrate, Japanese Published Patent Application No. 4-91482 discloses another structure for supporting the thin Si substrate. In the prior art, after forming a thin Si film, an AR film, and a comb-shaped surface electrode successively on a front surface of a low purity Si substrate, a cover glass is adhered to the front surface of the structure using a transparent adhesive, such as EVA (ethylene vinyl alcohol). Then, the low purity Si substrate is etched from the rear surface using a KOH (potassium hydroxide) solution until an oxide film serving as an etch stop is exposed from the rear surface. After the oxide film is etched away using hydrofluoric acid, Al is deposited on the rear surface by sputtering and baked to form a rear electrode and a BSF region opposite the rear electrode. The low purity Si substrate supports the thin Si film during the process steps on the front surface.

When a solar cell module is fabricated using a plurality of thin-film solar cells produced as described above, the surface electrode of each solar cell covered with the glass plate must outside the solar cell before the wire-bonding process connecting the solar cells. Since the solar cells are arranged in a matrix the modularization efficiency is reduced.

A description is now given of a method for forming an AR film employed in the above-described prior art thin-film solar cell.

FIGS. 30(a)-30(c) are sectional views illustrating process steps of forming an aperture pattern in an AR film.

Initially, an AR film 305 about 800 Å thick comprising SiN is formed on a Si substrate 301 in which a p-n junction active region 301a is formed, and an acid-proof photoresist 306 having an aperture 306a is screen-printed on the AR film 305 (FIG. 30(a)).

Using the acid-proof photoresist 306 as a mask, the AR film 305 is selectively etched with heated phosphoric acid, forming an aperture 305a (FIG. 30(b)). After removing the acid-proof photoresist 306, a surface electrode 310 is formed on the p-n junction active region 301a exposed in the aperture 305a (FIG. 30(c)).

In the above-described process steps of forming the AR film, however, since the aperture 305a of the AR film 305 is formed by the selective etching using the acid-proof photoresist 306 as a mask, the acid-proof photoresist 306 must be removed using an organic solvent or the like after the formation of the aperture 305a, complicating the production process. Since it is difficult to completely remove the acid-proof photoresist 306, the surface of the AR film 305 after the removal of the photoresist 306 is contaminated with the photoresist material, decreasing the quantity of light incident on the p-n junction active region 301a.

Where the AR film is of a two-layer structure to improve the effect of confining incident light in the p-n junction active region 301a, in addition to the above-described problems, the steps of forming the upper AR film and an aperture in the upper AR film are required, further complicating the production process.

A description is now given of a conventional etching process employed in the above-described method for producing a thin-film solar cell.

FIG. 31 is a schematic diagram illustrating a conventional automatic etching apparatus. In the figure, the automatic etching apparatus 400 includes a container 404 in which samples 407, such as semiconductor wafers, are put (hereinafter referred to as sample container), a conveyer 401 for conveying the sample container 404, and a controller 403 for controlling the conveyer 401. Reference numeral 405 designates a flask filled with an etchant 406.

The sample 407 is a device including a metal layer, semiconductor layer, insulating film, and the like, such as the above-described thin-film solar cell. The sample container 404 and the flask 405 comprise quartz or stainless steel (SUS). The controller 403 includes a timer 408 for setting the etching time.

The sample container 404 is put in the flask 405 filled with the etchant 406 by the conveyer 401. After the etching time set by the timer 408, the sample container 404 is taken out of the flask 405 by the conveyer 401.

Since the etching time is determined according to a previously measured etching rate, the etching depth in the sample 407 can be controlled by the etching time.

The operation of the etching apparatus 400 will be described in more detail.

The conveyer 401 conveys the sample container 404 containing the sample 407 to the flask 405 and immerses the container 404 in the etchant 406 according to the control signal from the controller 403. Then, the etching of the sample 407 is started. After the etching time set by the timer 408, the conveyer 401 pulls out the sample container 404 from the flask 405 according to the control signal from the controller 403. Then, the etching of the sample 407 is finished.

In the conventional automatic etching apparatus, even if the etching time set by the timer 408, i.e., the time during which the sample 407 is immersed in the etchant 406, is fixed, the etching depth in the sample unfavorably varies because the etching rate varies depending on the etchant and the sample.

SUMMARY OF THE INVENTION

It is an object of the present invention to provide a thin-film solar cell that is produced at reduced production cost by reducing the expensive high-purity material used for the active layer and that ensures high work efficiency when a solar cell module is fabricated using a plurality of the thin-film solar cells.

It is another object of the present invention to provide a method for producing a thin-film solar cell in which an AR film of two-layer structure is not contaminated with a mask material used for patterning the AR film, and the upper AR film serves as a mask for patterning a lower AR film, whereby the step of removing the mask is dispensed with.

It is still another object of the present invention to provide an etching method and an apparatus for the etching method, in which a desired etching depth is attained even if the etching rate varies during the etching process.

It is a further object of the present invention to provide a method for selectively etching a conductive or insulating substrate bearing a semiconductor active layer from the rear surface to form an aperture pattern, which method does not require a step of adhering the substrate to a holder using wax to protect the front and side surfaces from the etchant, whereby the process of forming the aperture pattern is simplified and the surface of the substrate is not contaminated with the wax.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a thin-film solar cell, a structure for supporting a thin active layer of high purity material performing light-to-electricity conversion comprises a substrate of low purity material supporting the active layer and an insulating barrier layer interposed between the supporting substrate and the active layer. The barrier layer prevents impurities in the supporting substrate from diffusing into the active layer. Since the supporting substrate comprises a low purity material, the quantity of expensive high purity material can be reduced by reducing the thickness of the active layer, resulting in low production costs. Since the rear surface of the active layer is selectively exposed on the rear surface of the supporting substrate, a rear electrode is easily in contact with the active layer from the rear surface of the supporting substrate. In addition, since the supporting substrate is present on the rear surface of the active layer, a surface electrode of the solar cell is exposed. Therefore, when a solar cell module is fabricated using a plurality of the solar cells, a wire bonding process for connecting adjacent solar cells is easily carried out compared to the conventional solar cell having the surface electrode covered with a transparent plate.

According to a second aspect of the present invention, a surface electrode of the thin-film solar cell comprises a linear bus electrode and a plurality of grid electrodes perpendicularly protruding from opposite sides of the bus electrode. The surface electrode is disposed on the active layer so that the linear bus electrode is opposed to a linear part of the supporting substrate. Therefore, the bus electrode can withstand a mechanical stress applied to the bus electrode during the wire bonding process.

According to a third aspect of the present invention, the rear electrode of the thin-film solar cell comprises a high reflectance material. Therefore, the greater part of incident light transmitted through the active layer is reflected by the rear electrode, increasing the light-to-electricity conversion efficiency of the incident light.

According to a fourth aspect of the present invention, an anti-reflection film for preventing incident light from being reflected at the surface of the active layer is disposed on the active layer, and a plurality of pyramidal projections are formed on the surface of the active layer, which projections increase the optical path length of the incident light in the active layer, increasing the light-to-electricity conversion efficiency. If a plurality of pyramidal projections are formed on both the front and rear surfaces of the active layer, the light-to-electricity conversion efficiency is further improved.

According to a fifth aspect of the present invention, in a method for producing a thin-film solar cell, an insulating film is formed on a substrate comprising a low purity material, a first conductivity type active layer comprising a high purity material is formed on the insulating film, a second conductivity type region is formed within the active layer reaching the surface to form a p-n junction performing light-to-electricity conversion, an anti-reflection film for reducing the reflection of incident light is selectively formed on the active layer, a surface electrode is formed on a region of the active layer where the anti-reflection film is absent, a supporting plate is adhered to the front surface of the structure and the low purity substrate is selectively etched from the rear surface to form the substrate in a desired shape that can support the active layer, and a rear surface is formed on the rear surface of the supporting substrate contacting the active layer. The etching process of the low purity substrate employs an etchant that etches the low purity substrate but does not etch the insulating film. Therefore, the insulating film serves as an etch stop that prevents the thin active layer from being etched.

According to a sixth aspect of the present invention, in the above-described production method, before the formation of the anti-reflection film, the surface of the active layer is subjected to a surface texturing process, i.e., a plurality of pyramidal projections are formed on the surface, whereby the optical path length of incident light in the active layer is increased, improving the light-to-electricity conversion efficiency in the active layer. If the rear surface of the active layer is also subjected to the surface texturing process before the formation of the rear electrode, the light-to-electricity conversion efficiency is further improved.

According to a seventh aspect of the present invention, in the above-described production method, an insulating film, a high purity semiconductor layer, and a cap layer comprising SiO or SiN are successively deposited on the low purity substrate. The cap layer is adhered to a supporting plate using a wax, and the low purity substrate is completely etched away from the rear surface. Then, the laminated layers are put on a heat resistant base having a small impurity diffusion coefficient, and the supporting plate is removed from the cap layer, followed by annealing to increase the crystal grain size of the high purity semiconductor layer. Thereafter, the laminated layers are removed from the heat resistant base and put on another low purity substrate. In this method, since the high temperature annealing process of the active layer is carried out on the heat resistant base, a low purity material cheaper than that employed in the above-described production method can be employed as the substrate.

According to an eighth aspect of the present invention, in a method for producing a thin-film solar cell, a lower anti-reflection film having a relatively large etching rate in a prescribed etchant and an upper anti-reflection film having a relatively small etching rate in the etchant are successively formed on a photosensitive surface of a semiconductor substrate. The upper anti-reflection film is patterned to form an aperture, and the lower anti-reflection film is etched with the etchant using the patterned upper anti-reflection film as a mask, forming an aperture in the lower anti-reflection film. In this method, since the upper anti-reflection film serves as a mask for patterning the lower anti-reflection film, the step of removing the mask can be dispensed with. In addition, since the entire surface of the upper anti-reflection film is subjected to the etching process after a photoresist mask used for patterning the upper anti-reflection film is removed, the surface of the upper anti-reflection film is not contaminated with the photoresist. Since a portion of the upper anti-reflection film is etched when etching the lower anti-reflection film, the upper anti-reflection film deposited on the substrate must be thicker than the optimum thickness so that the optimum thickness is attained after etching of the lower anti-reflection film.

According to a ninth aspect of the present invention, in a method for etching a selected portion of a substrate, the substrate includes an etch stop layer having a reflectance different from that of the substrate and embedded in the substrate at a prescribed depth from the surface. The substrate is etched while monitoring the reflectance at the etching surface, and the etching is stopped when the etch stop layer is exposed at the etching surface and the reflectance changes. Therefore, a desired etching depth in the substrate is attained even if the etching rate varies during the etching process.

According to a tenth aspect of the present invention, in a method for etching a selected portion of a substrate, the substrate has a prescribed crystal structure and a first crystal plane exposed at a flat surface of the selected portion of the substrate and a second crystal plane. An etchant having a crystal plane selectivity for the second crystal plane is employed. The substrate is etched while monitoring the reflectance at the etching surface, and the etching is stopped when the flat surface of the substrate becomes uneven, i.e., a textured surface, and the reflectance at the etching surface changes. Therefore, a desired etching depth in the substrate is attained even if the etching rate during the etching process varies. In addition, the process of forming the etch stop layer can be dispensed with.

According to an eleventh aspect of the present invention, an automatic etching apparatus includes a flask filled with an etchant, a container containing a sample to be etched, a conveyer conveying the container, and a controller controlling the conveyer so that the container is immersed in or taken out from the etchant, and a reflectance monitoring apparatus including means for irradiating an etching surface of the sample immersed in the etchant with light and means for measuring the light reflected at the etching surface. The controller receives a monitor signal from the reflectance monitoring apparatus and controls the conveyer according to the monitor signal so that the container is taken out from the etchant when the reflectance varies.

According to a twelfth aspect of the present invention, in a method for etching a selected portion of a substrate using a prescribed etchant, the substrate includes an etch stop layer having a resistance to the etchant and embedded at a prescribed depth from the surface of the substrate. The etching is carried out while monitoring the light transmittance in the etchant, and the etching is stopped when bubbles caused by a chemical reaction between the etchant and the substrate disappear and the light transmittance changes. Therefore, a desired etching depth in the substrate is attained even if the etching rate varies during the etching process.

According to a thirteenth aspect of the present invention, the above-described etching apparatus includes, in place of the reflectance monitoring apparatus, a light transmittance monitoring apparatus comprising means for irradiating the etchant with light and means for measuring the light transmitted through the etchant. The controller receives a monitor signal from the light transmittance monitoring apparatus and controls the conveyer so that the container is taken out of the etchant when bubbles caused by the chemical reaction between the etchant and the substrate disappear and the light transmittance in the etchant changes.

According to a fourteenth aspect of the present invention, in a method for producing a thin-film solar cell, a semiconductor layer of prescribed crystal structure performing light-to-electricity conversion is prepared. The semiconductor layer has a first crystal plane exposed at a flat surface of the substrate and a second crystal plane. The flat surface of the semiconductor layer is etched with an etchant having a crystal plane selectivity to the second crystal plane while monitoring the reflectance of incident light at the etching surface. The etching is stopped when the flat surface of the semiconductor layer becomes uneven, i.e., a textured surface, and the reflectance at the etching surface changes. Therefore, a desired etching depth is attained even if the etching rate varies during the etching process.

According to a fifteenth aspect of the present invention, in a method for producing a semiconductor device, a conductive or insulating substrate having opposite front and rear surfaces is prepared, a semiconductor active layer is formed on the front surface of the substrate, the substrate is completely covered with a protective film except for a part on the rear surface of the substrate, and the substrate is selectively etched from the rear surface using the etchant to form an aperture. In this method, since the conventional step of adhering the substrate to a holder using wax is dispensed with, the production process is simplified and the surface of the substrate is not contaminated with the wax. If the protective film has a two-layer structure, selective etching between the active layer and the protective film is possible when the protective film is removed by etching, whereby the active layer is not adversely affected by the etching process.

DETAILED DESCRIPTION OF THE PREFERRED EMBODIMENTS

Figure 1:
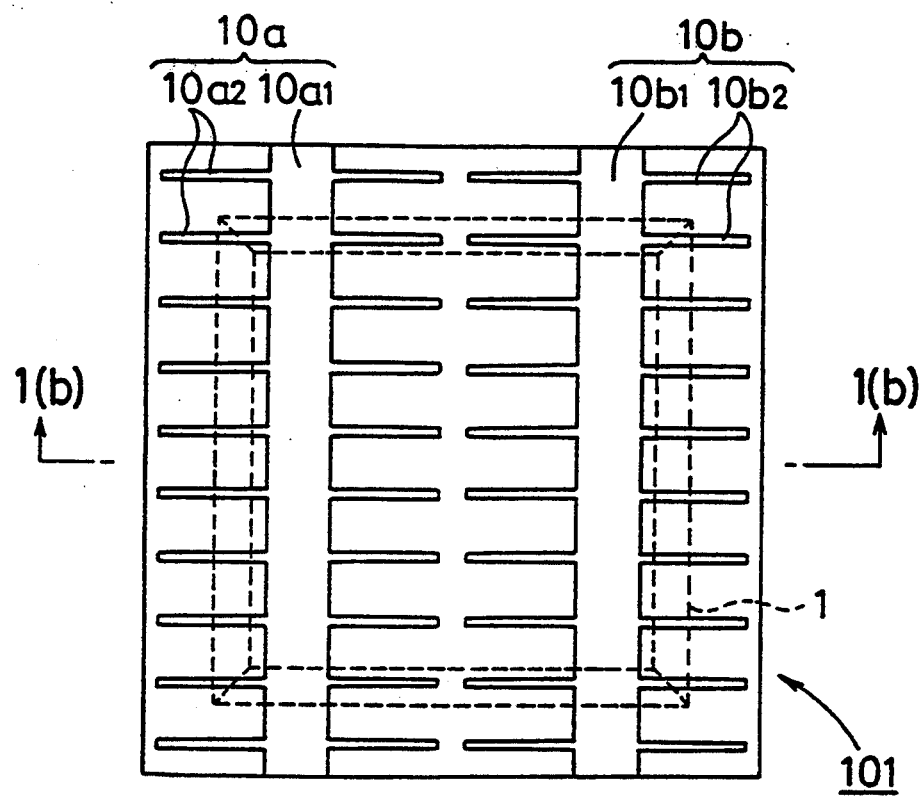
FIGS. 1(a) and 1(b) are a plan view and a sectional view illustrating a thin-film solar cell in accordance with a first embodiment of the present invention.
Figure 1:
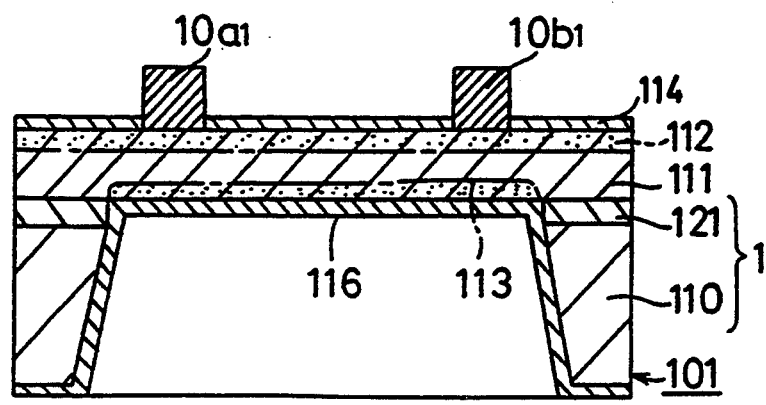

FIGS. 1(a) and 1(b) are diagrams illustrating a thin-film solar cell in accordance with a first embodiment of the present invention, in which FIG. 1(a) is a plan view and FIG. 1(b) is a sectional view taken along line 1b—1b of FIG. 1(a).

In the figures, reference numeral 101 designates a ten square centimeter thin-film solar cell. The solar cell 101 includes a thin active layer 111 comprising high purity p type silicon performing light-to-electricity conversion and a supporting structure 1 for supporting the thin active layer 1. The supporting structure 1 comprises a supporting substrate 110 comprising a low purity material, such as MG-Si (i.e. metallurgical grade), and an SiO (silicon oxide) film 121 interposed between the supporting substrate 110 and the active layer 111. The SiO film 121 serves as an insulating barrier preventing impurities in the supporting substrate 110 from diffusing into the active layer 111.

The supporting substrate 110 is shaped like a square frame along edges of the active layer 111. An n type impurity diffused region 112 is disposed within the active layer 111 reaching the surface thereof. Comb-shaped surface electrodes 10a and 10b are disposed on the n type region 112 spaced apart from each other. The surface electrodes 10a (10b) comprise a plurality of grid electrodes $10a_2$ ($10b_2$) and a common-bus electrode $10a_1$ ($10b_1$). The bus electrodes $10a_1$ and $10b_1$ are parallel to each other. In operation, photocurrent generated on the surface of the thin-film solar cell 101 is collected by the grid electrodes $10a_2$ and $10b_2$ and transferred to the respective bus electrodes $10a_1$ and $10b_1$. An anti-reflection (AR) film 114 comprising SiN (silicon nitride) is disposed on portions of the active layer 111 where the surface electrodes 10a and 10b are absent. The AR film 114 effectively confines incident light within the active layer 111.

A rear electrode 116 is disposed on the rear surface of the supporting substrate 110 contacting the active layer 111. The rear electrode 116 comprises a metal of high reflectance, such as Ag. A high impurity dopant concentration p type BSF (Back Surface Field) region 113 is disposed within the active layer 111 contacting the rear electrode 116.

In this first embodiment, the width of the frame-shaped supporting substrate 110 is determined so that it does not adversely affect the performance of the solar cell. For example, the width is below 10 mm if the BSF region 113 has an impurity dopant concentration of $1 \times 10^{18}$ $^8$cm$^{-3}$ and a thickness of 20 μm.

Figure 2:
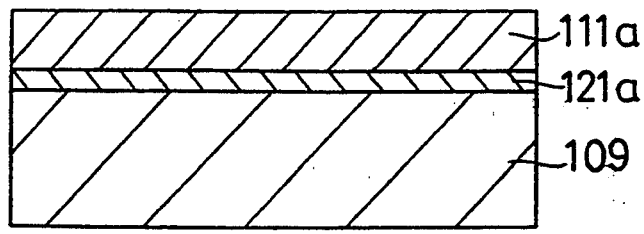
FIGS. 2(a)-2(d) are sectional views illustrating process steps in a method for producing the thin-film solar cell of FIGS. 1(a)-1(b).
Figure 2:
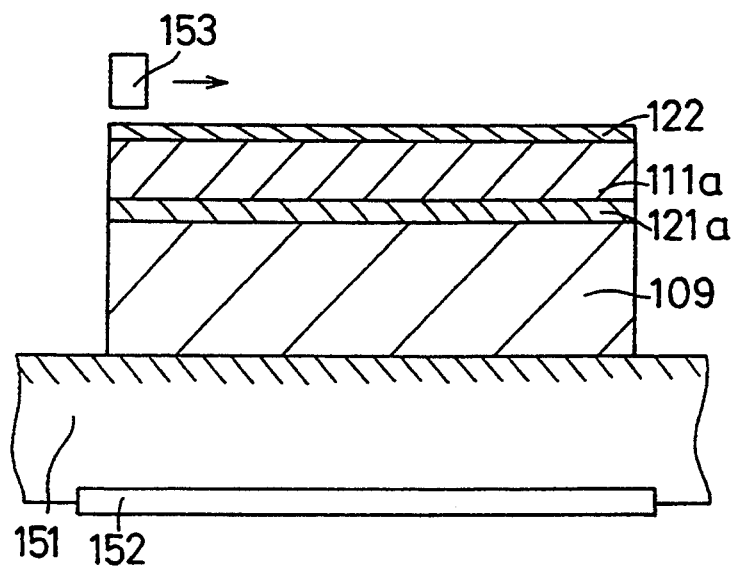
Figure 2:
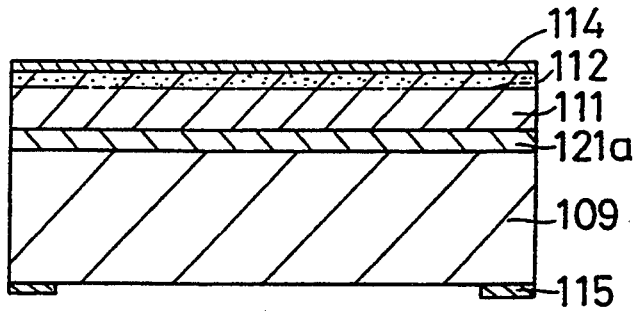
Figure 2:
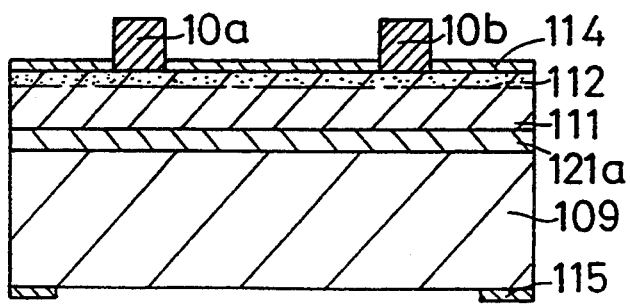
Figure 3:
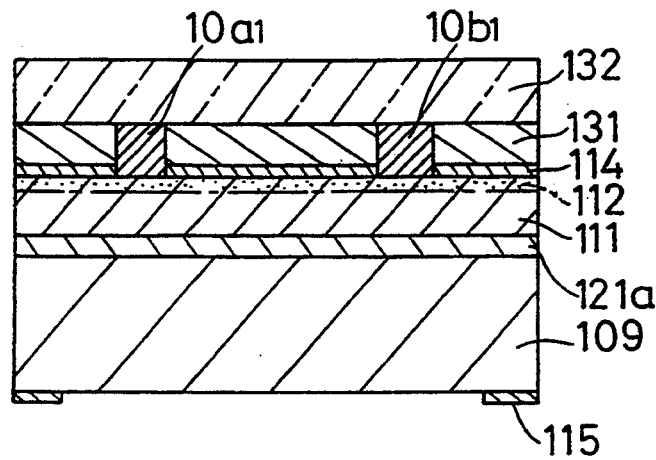
FIGS. 3(a)-3(c) are sectional views illustrating process steps in the method for producing the thin-film solar cell of FIGS. 1(a)-1(b).
Figure 3:
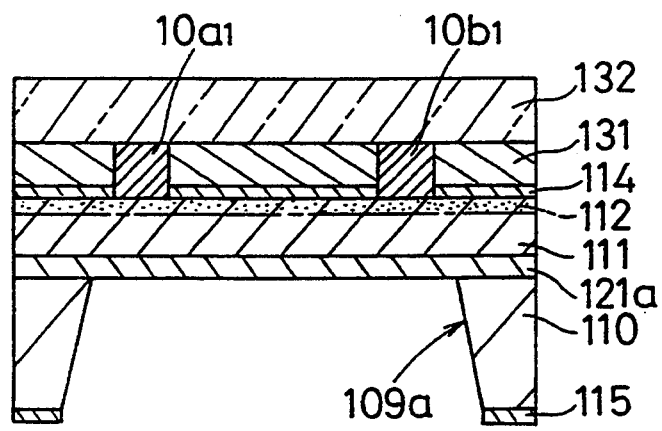
Figure 3:
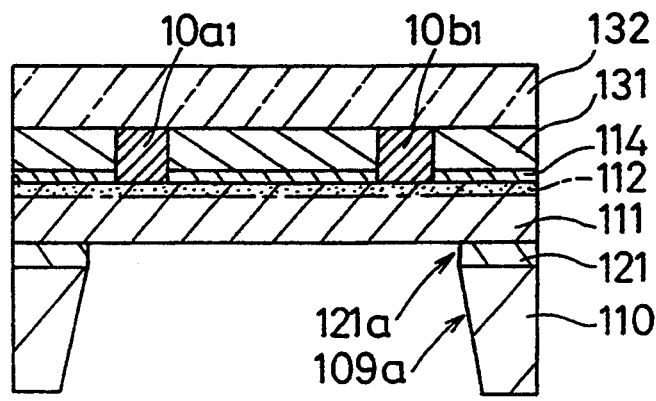
Figure 4:
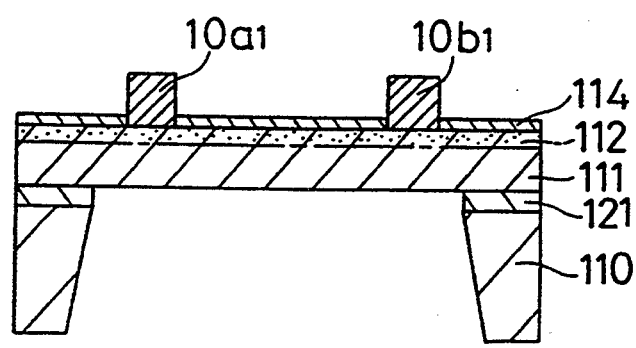
FIGS. 4(a)-4(b) are sectional views illustrating process steps of forming a rear electrode in the method for producing the thin-film solar cell of FIGS. 1(a)-1(b).
Figure 4:
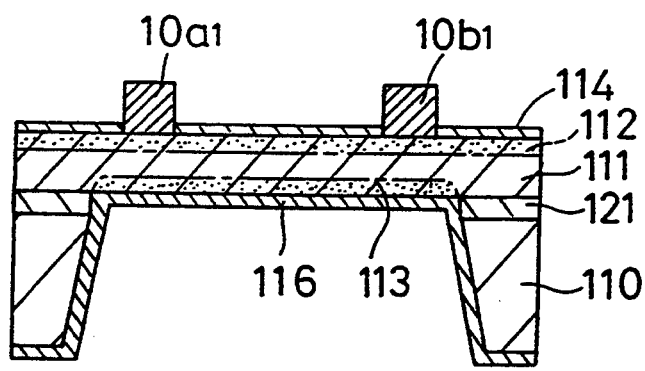

A method for producing the thin-film solar cell is illustrated in FIGS. 2(a)-2(d), 3(a)-3(c), and 4(a)-4(b). More specifically, FIGS. 2(a)-2(d) illustrate process steps on the front surface, FIGS. 3(a)-3(c) illustrate process steps of forming the supporting structure, and FIGS. 4(a)-4(b) illustrate process steps of forming the rear electrode.

Initially, an SiO film 121a several microns thick is deposited over a low purity silicon substrate 109 about several hundreds of microns thick, preferably by LPCVD, thermal oxidation, or sputtering. Then, a high purity p type Si is deposited on the SiO film 121a to a thickness of 100 μm or less, preferably by thermal CVD or LPCVD, forming a Si thin layer 111a (FIG. 2(a)).

After forming a cap layer 122 comprising $SiO_2$ or SiN on the Si thin layer 111a, the substrate is put on a carbon base 151. A movable upper heater 153 is moved along the direction indicated by the arrow while heating the Si thin layer 111a from the rear surface using a lower heater 152 fixed to the bottom of the carbon base 151, whereby the grain size of the Si thin layer 111a is increased by zone melting and recrystallization (ZMR), resulting in an active layer 111 (FIG. 2(b)).

After removing the cap layer 122, n type dopant, such as phosphorus, is diffused into the active layer 111 from the front surface to form an n type region 112. Preferably, the n type region 112 is thinner than 0.5 μm. A p-n junction is produced between the n type region 112 and the p type active layer 111. Then, SiN is deposited on the n type region 112 to a thickness of 800~1000 Å, preferably by plasma CVD or OPCVD, forming an AR film 114. At the same time, SiN is deposited on the rear surface of the low purity Si substrate 110a to a thickness of below 1000 Å.

After a part of the SiN film on the rear surface is masked with an acid-proof photoresist, the SiN film is etched with hydrofluoric acid, leaving a portion 115 on a region of the low purity substrate 109 where the above-described frame-shaped supporting substrate 110 is to be formed (FIG. 2(c)).

In the step of FIG. 2(d), an acid-proof photoresist (not shown) is selectively screen-printed on the SiN film 114 except portions where the surface electrodes 10a and 10b are to be formed and then it is baked. Using the acid-proof photoresist as a mask, portions of the SiN film 114 are etched with hydrofluoric acid, selectively exposing the n type region 112 of the active layer 111. After removing the acid-proof photoresist pattern, Ag paste is screen-printed on the exposed portions of the n type region 112 to a thickness of 20-30 μm. Then, the Ag paste is baked to complete the surface electrodes 10a and 10b.

An alkali-proof wax 131 having a melting point of 150°-230° C. is deposited over the front surface and a glass plate 132 is adhered to the front surface via the wax 131 (FIG. 3(a)). In place of the glass plate, a stainless steel plate (SUS) may be employed.

Then, the substrate is immersed in several tens of wt. % KOH solution to etch the low purity substrate 109 (FIG. 3(b)). Since the SiN film 115 serves as a mask, only a center part of the low purity substrate 109 is etched away. In the KOH solution, Si is etched at an etching rate about several hundreds times as high as that of SiN, so that the etching is stopped at the SiO film 121a. That is, the SiO film 121a serves as an etch stop during the etching process using the KOH solution.

In the step of FIG. 3(c), the SiN film 115 used as the etching mask and the SiO film 121a used as the etch stop are removed using hydrofluoric acid. Thereafter, the glass plate 132 is removed from the surface of the active layer 111 (FIG. 4(a)).

In the step of FIG. 4(b), Al is deposited over the rear surface of the structure to a thickness of about 1 μm, preferably by sputtering or vapor deposition, forming the rear electrode 116. The rear electrode 116 is baked at 500°~800° C. to form a p type BSF region 113 within the active layer 111 contacting the rear electrode 116 (FIG. 4(b)).

While in the prior art thin-film solar cell both the active layer and the substrate supporting the active layer comprise the high purity material, in this first embodiment of the present invention only the active layer 111 which is thinner than 100 μm and performs light-to-electricity conversion comprises a high purity material. The thick substrate 110 supporting the thin active layer 111 comprises a low purity material. Therefore, a thin-film solar cell is manufactured with less high purity material, resulting in a reduction of the production cost.

The insulating SiO film 121 interposed between the supporting substrate 110 of the low purity material and the active layer 111 of the high purity material prevents impurities in the low purity substrate 109 from diffusing into the active layer 111 during thermal processing. In addition, in the selective etching of the low purity substrate 109, the insulating film 121 serves as an etch stop and prevents the thin active layer 111 from being etched. Therefore, the supporting substrate 110 is formed with high precision.

Since the supporting substrate 110 is a frame shape along the edges of the active layer, a part of the active layer is exposed in the center of the rear surface of the supporting substrate 110. Therefore, the contact between the rear electrode 116 and the active layer 111 is easily made if the rear electrode is deposited over the entire surface of the supporting substrate.

Since the supporting substrate 110 is present on the rear surface of the active layer 111, the surface electrodes 10a and 10b of the solar cell 101 are exposed. Therefore, when a plurality of the solar cells 101 are arranged in matrix on a mounting substrate to fabricate a solar cell module, connection between adjacent solar cells is easily made compared to the prior art solar cell having surface electrodes covered with the supporting substrate.

While in the above-described first embodiment an SiO film is employed as the insulating film 121 interposed between the supporting substrate 110 and the active layer 111, an SiN film may Be employed with the same effects as described above.

The structure of the supporting substrate 110 is not restricted to the frame-shaped structure shown in FIG. 1(a). A variety of structures can be thought of and some of them will be described hereinafter as variations of the first embodiment of the present invention.

Figure 5:
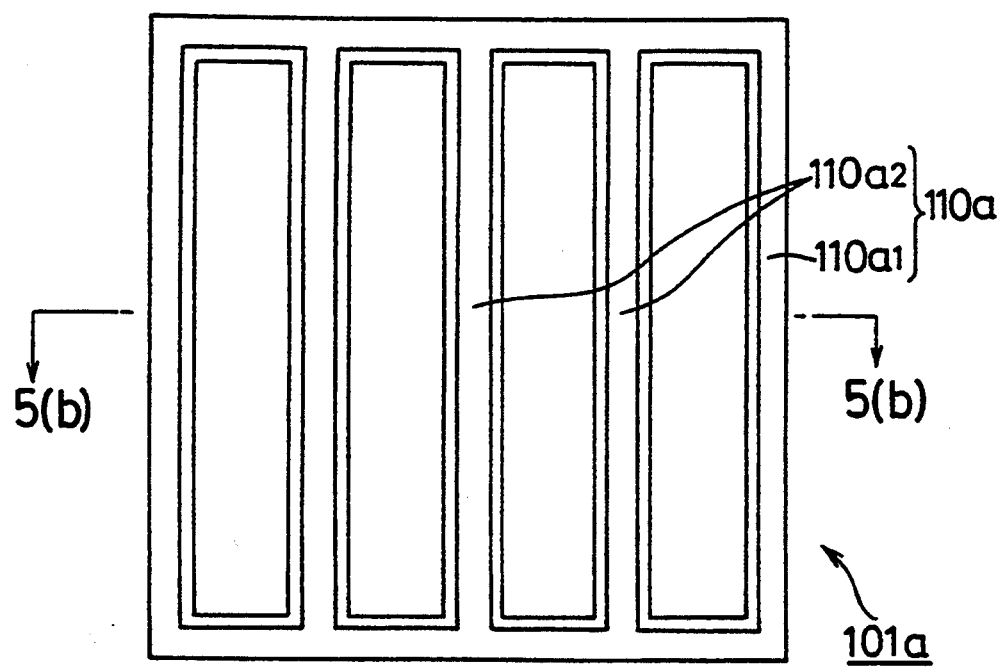
FIGS. 5(a) and 5(b) are a plan view and a sectional view illustrating a thin-film solar cell according to a first variation of the thin-film solar cell shown in FIGS. 1(a)-1(b).
Figure 5:
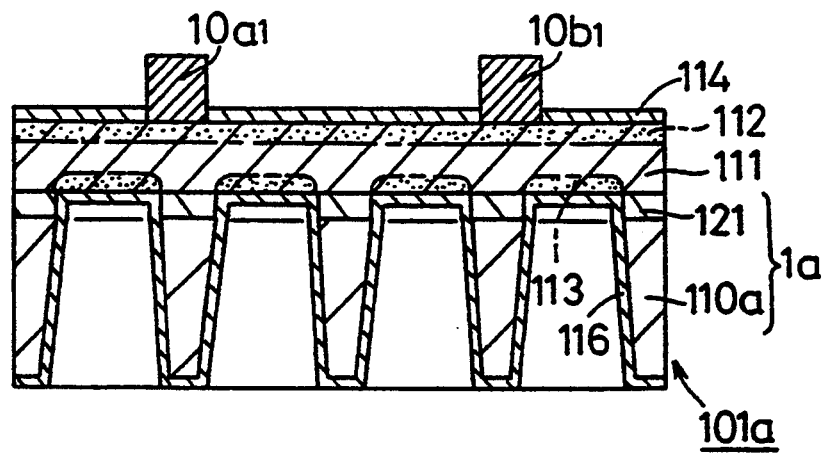

FIGS. 5(a) and 5(b) are diagrams illustrating a thin-film solar cell according to a first variation of the thin-film solar cell 101 shown in FIGS. 1(a)–1(b), in which FIG. 5(a) is a bottom plan view and FIG. 5(b) is a sectional view taken along line Vb—Vb of FIG. 5(a). In this variation, the thin-film solar cell 101a includes a striped supporting substrate 110a in place of the frame-shaped supporting substrate 110. The striped supporting substrate 110a comprises a frame part 110$a_1$ disposed along the edges of the active layer 111 and a plurality of spaced-apart parallel ribs 110$a_2$ arranged inside the frame part 110$a_1$. The supporting structure 1a comprises the supporting substrate 110a and the insulating film 121. Other structures are identical to those already described with respect to FIGS. 1(a) and 1(b).

Figure 6:
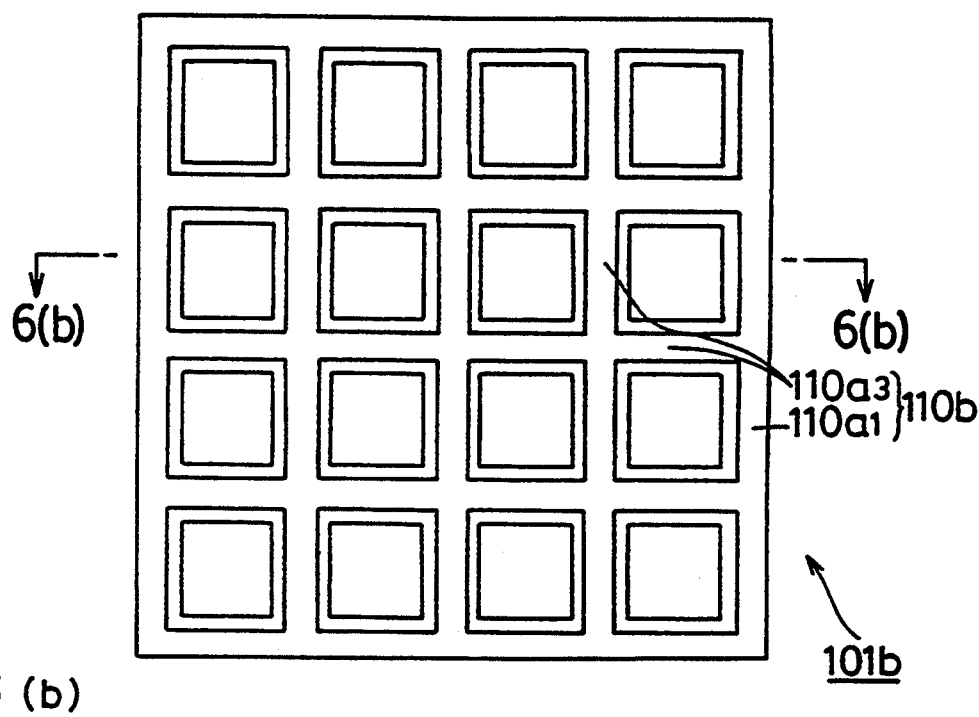
FIGS. 6(a) and 6(b) are a plan view and a sectional view illustrating a thin-film solar cell according to a second variation of the thin-film solar cell shown in FIGS. 1(a)-1(b).
Figure 6:
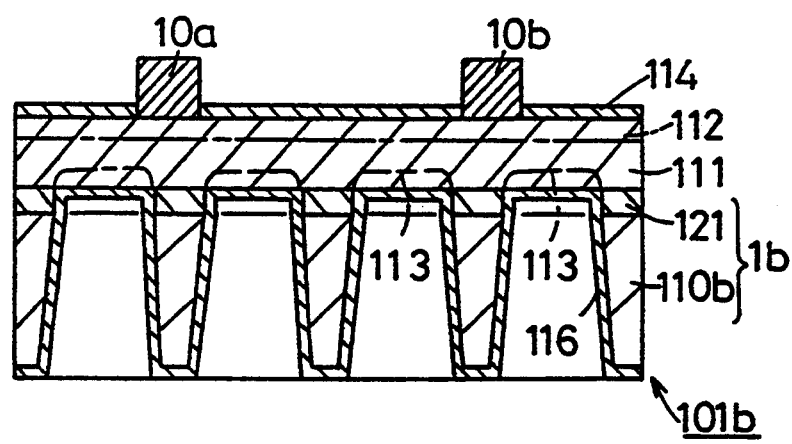

FIGS. 6(a) and 6(b) illustrate a thin-film solar cell according to a second variation of the thin-film solar cell 101 shown in FIGS. 1(a)–1(b), in which FIG. 6(a) is a bottom plan view and FIG. 6(b) is a sectional view taken along line 6(b)—6(b) of FIG. 6(a). In this second variation, the thin-film solar cell 101b includes a honeycomb supporting substrate 110b in place of the frame-shaped supporting substrate 110. The honeycomb supporting substrate 110b comprises a frame part 110$a_1$ disposed along the edges of the active layer 111 and a lattice part 110$a_3$ disposed inside the frame part. The supporting structure 1b comprises the supporting substrate 110b and the insulating film 121. Other structures are identical to those already described with respect to FIGS. 1(a) and 1(b).

Figure 7:
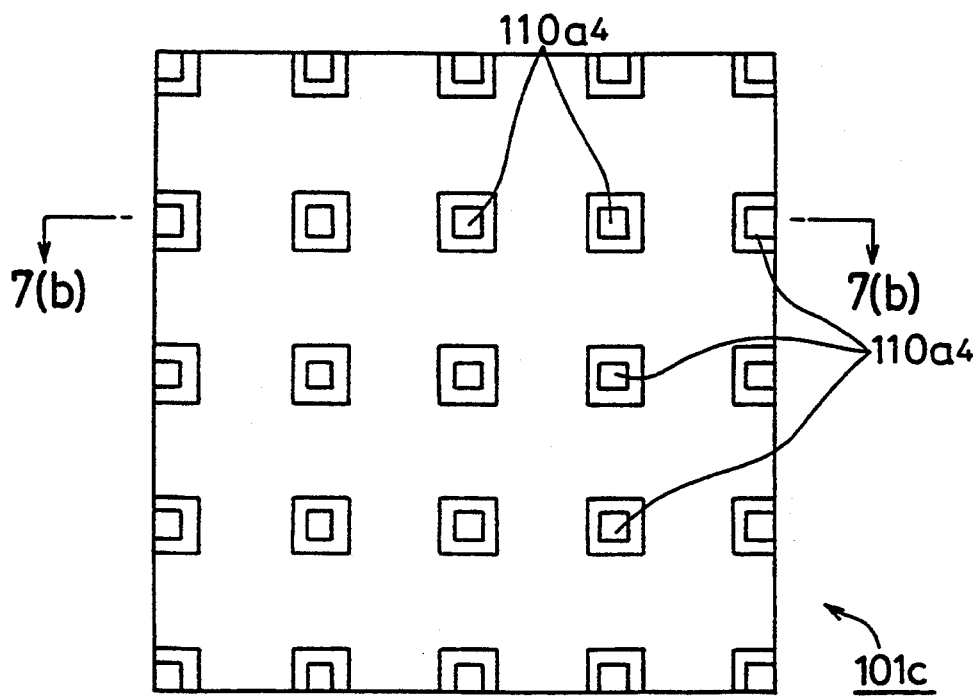
FIGS. 7(a) and 7(b) are a plan view and a sectional view illustrating a thin-film solar cell according to a third variation of the thin-film solar cell shown in FIGS. 1(a)-1(b).
Figure 7:
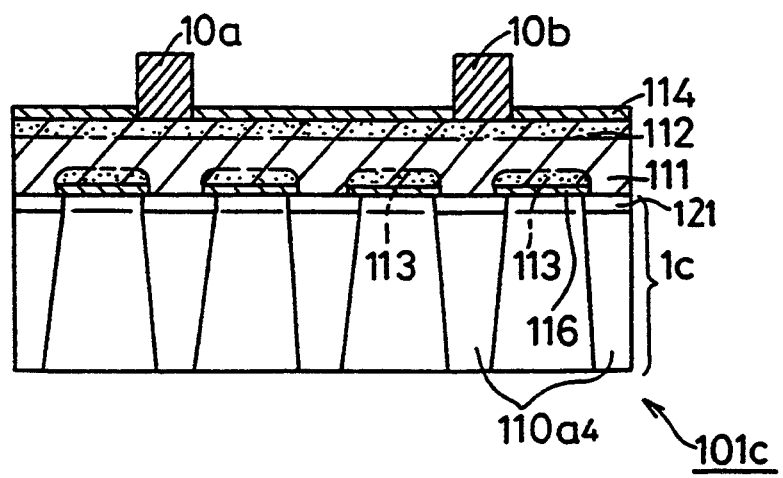

FIGS. 7(a) and 7(b) illustrate a thin-film solar cell according to a third variation of the thin-film solar cell 101 shown in FIGS. 1(a)–1(b), in which FIG. 7(a) is a bottom plan view and FIG. 7(b) is a sectional view taken along line 7(a)—7(b) of FIG. 7(a). In this third variation, the thin-film solar cell 101c includes a plurality of pillars 110$a_4$ disposed on the rear surface of the active layer 111 in place of the frame-shaped supporting substrate 110. The supporting structure 1c comprises the pillars 110$a_4$ and the insulating barrier layers 121. Other structures are identical to those already described with respect to FIGS. 1(a) and 1(b).

The structure of the supporting substrate is not restricted to those described above. For example, a polygonal frame-shaped supporting substrate or a spiral supporting substrate may be employed.

Figure 8:
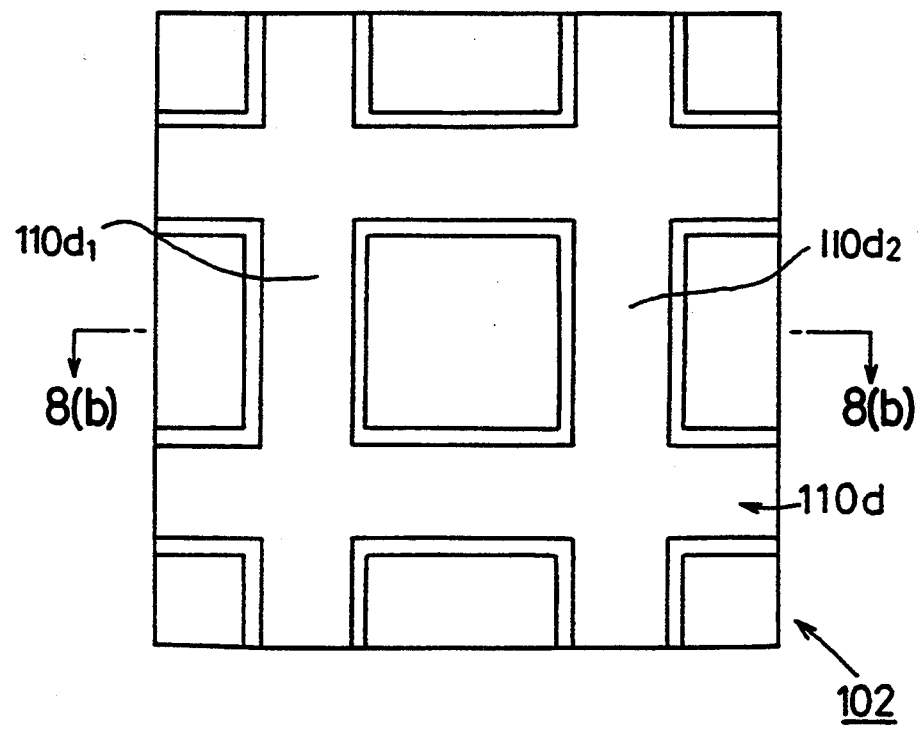
FIGS. 8(a) and 8(b) are a plan view and a sectional view illustrating a thin-film solar cell in accordance with a second embodiment of the present invention.
Figure 8:
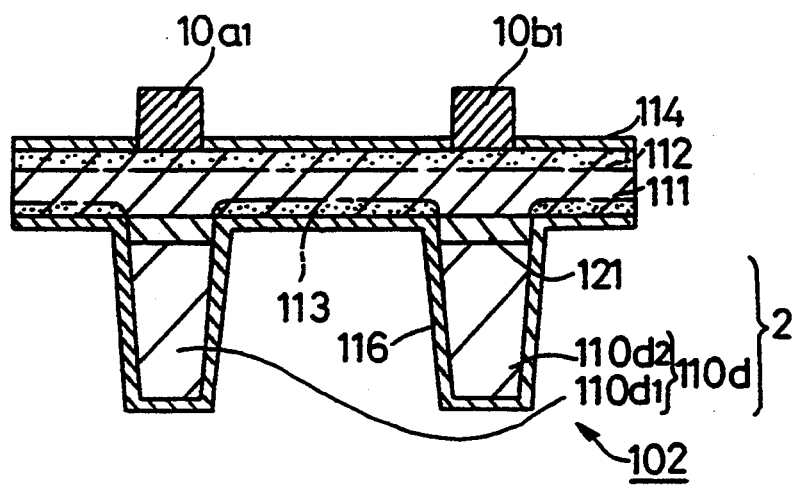

FIGS. 8(a) and 8(b) are diagrams illustrating a thin-film solar cell in accordance with a second embodiment of the present invention, in which FIG. 8(a) is a bottom plan view and FIG. 8(b) is a sectional view taken along line 8(b)—8(b) of FIG. 8(a). In this second embodiment, the supporting structure 2 comprises a honeycomb supporting substrate 110d and the insulating film 121. The comb-shaped surface electrodes 10a and 10b are disposed on the active layer 111 so that the linear bus electrodes 10$a_1$ and 10$b_1$ are positioned opposite the linear portions 110$d_1$ and 110$d_2$ of the supporting substrate 110d, respectively. When a solar cell module is fabricated using a plurality of the thin-film solar cells of the second embodiment, the bus electrode can bear the mechanical stress applied to the bus electrode during the wire bonding process.

This second embodiment of the present invention may be applied to the thin-film solar cells 101a and 101b of FIGS. 5(a)–5(b) and 6(a)–6(b), respectively, with the same effect as described above.

Figure 9:
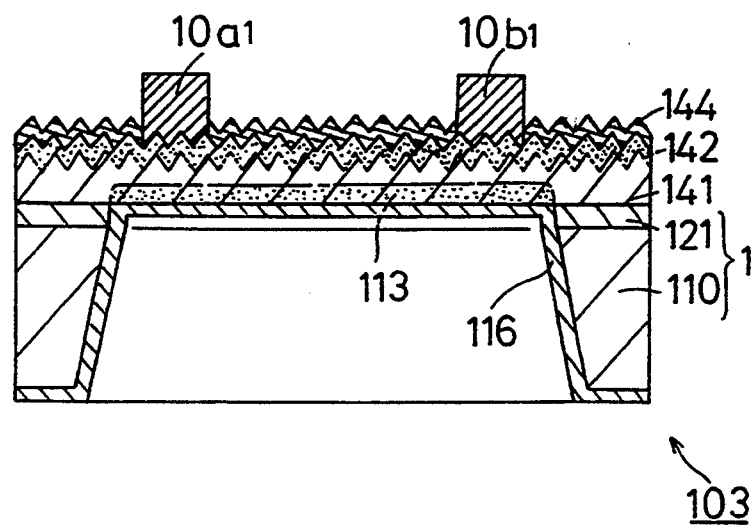
FIGS. 9(a) and 9(b) are sectional views illustrating thin-film solar cells in accordance with a third embodiment of the present invention.
Figure 9:
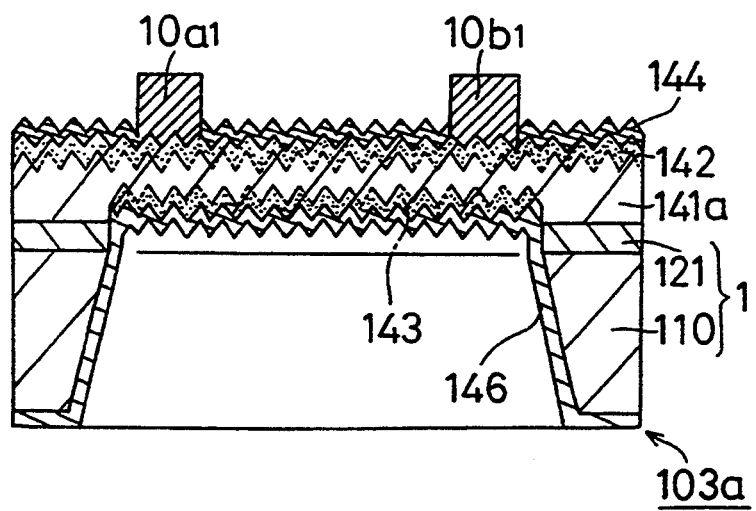

FIG. 9(a) is a sectional view illustrating a thin-film solar cell according to a third embodiment of the present invention. The thin-film solar cell 103 of this third embodiment includes an active layer 141 having a textured surface, i.e., a surface with a plurality of pyramidal projections, which increases the optical path length of incident light in the active layer. Other structures are identical to those of the thin-film solar cell 101 according to the first embodiment.

Figure 10:
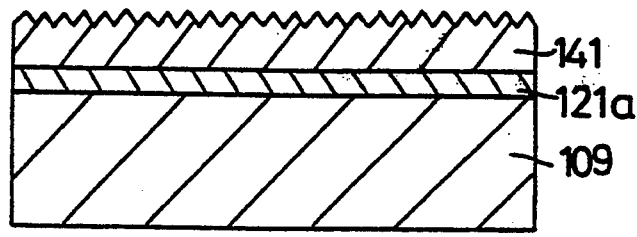
FIGS. 10(a)-10(d) are sectional views illustrating process steps in a method for producing the thin-film solar cell of FIGS. 9(a)-9(b).
Figure 10:
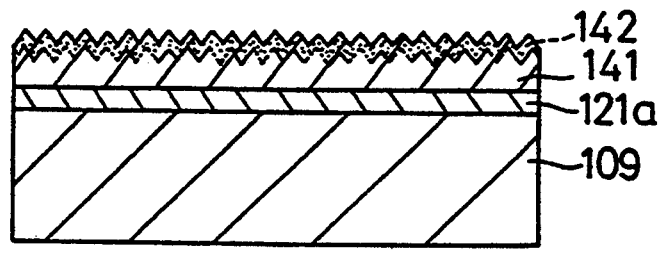
Figure 10:
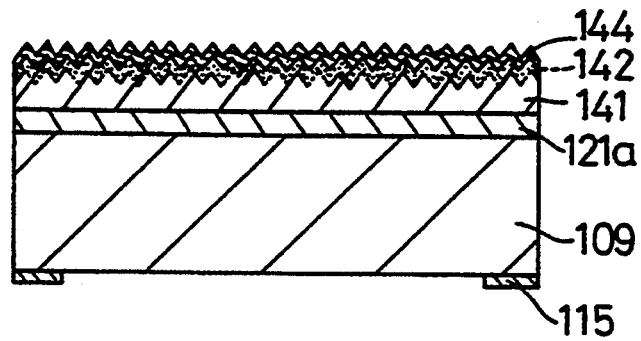
Figure 10:
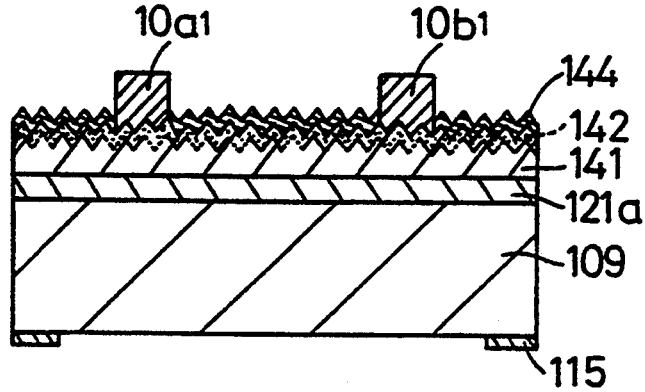
Figure 11:
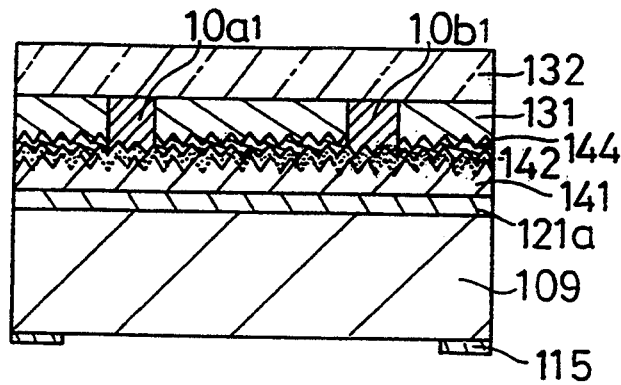
FIGS. 11(a)-11(d) are sectional views illustrating process steps in the method for producing the thin-film solar cell of FIGS. 9(a)-9(b).
Figure 11:
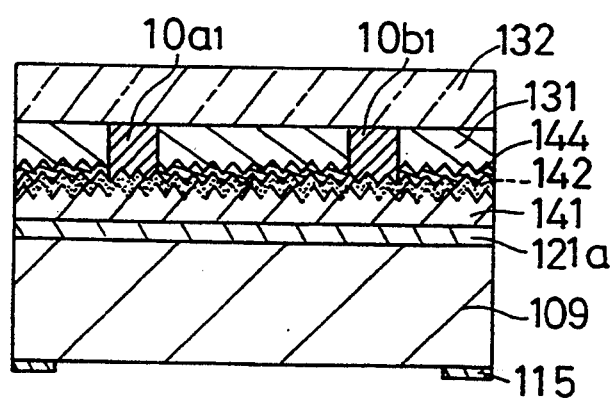
Figure 11:
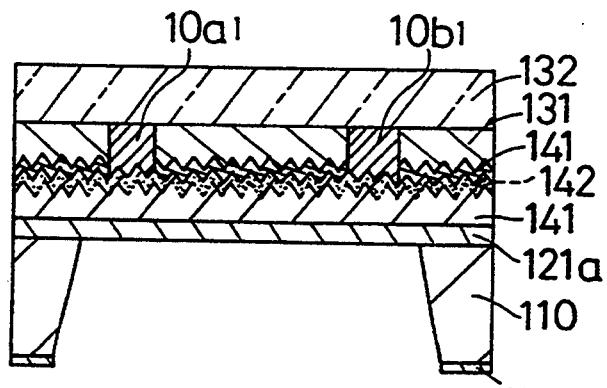
Figure 11:
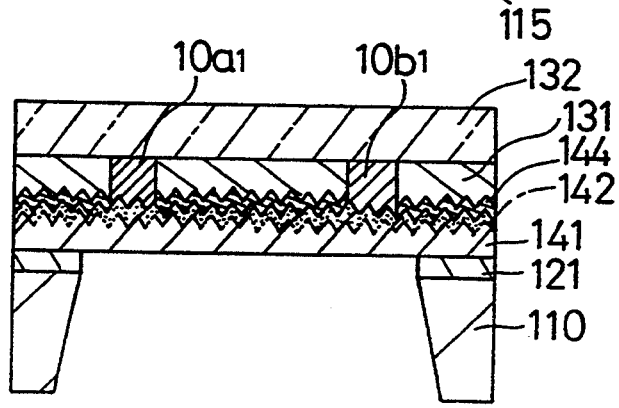
Figure 12:
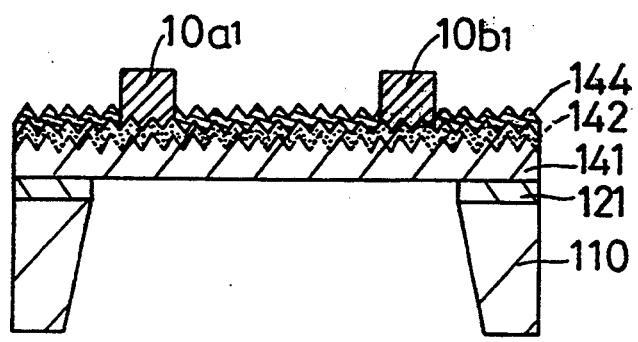
FIGS. 12(a) and 12(b) are sectional views illustrating process steps of forming a rear electrode in the method for producing the thin-film solar cell of FIG. 9(a).
Figure 12:
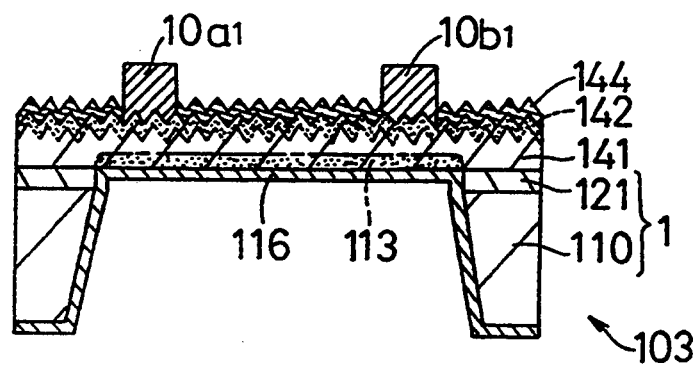

A method for manufacturing the thin-film solar cell 103 is illustrated in FIGS. 10(a)–10(d), 11(a)–11(c), and 12(a)–12(b). More specifically, FIGS. 10(a)–10(d) illustrate process steps performed on the front surface side, FIGS. 11(a)–11(c) illustrate process steps of forming the supporting structure, and FIGS. 12(a)–12(b) illustrate process steps of forming the rear electrode.

Initially, as illustrated in FIG. 2(a), a SiO film 121a several microns thick is deposited over a low purity Si substrate 109, and a Si layer 141 thinner than 100 $\mu$m is deposited over the SiO film 121a. Thereafter, the thin Si layer 141 is subjected to a zone melting and recrystallization process, forming an active layer with a (100) surface orientation. Then, the surface of the active layer is subjected to a wet etching using a mixture of alkali, such as KOH or NaOH, and water, forming a plurality of pyramidal projections of (111) planes on the surface of the active layer 141 (FIG. 10(a)). The etching rate and the apex angle of the pyramidal projections are controlled by adding an appropriate quantity of alcohol to the etchant.

In the steps of FIG. 10(b), an n type dopant, such as phosphorus, is diffused into the active layer 141 from the surface to form an n type region 142 that produces a p-n junction with the p type active layer 141. Preferably, the n type region 142 is thinner than 0.5 $\mu$m. Then, SiN is deposited over the n type region 142, forming an AR film 144. At the same time, SiN is deposited on the rear surface of the low purity Si substrate 109. Then the SiN film on the rear surface is patterned leaving a portion 115 on a region where the above-described frame-shaped supporting substrate 110 is to be formed (FIG. 10(c)).

In the step of FIG. 10(d), portions of the SiN AR film 144 are selectively etched away to expose the active layer 141, and the surface electrodes 10a and 10b are formed on the exposed portions of the active layer 141.

Then, a wax 131 is applied to the front surface (FIG. 11(a)), and a glass plate 132 is attached to the front surface via the wax 131 (FIG. 11(b)), followed by etching the low purity substrate 109 and the insulating film 121a (FIGS. 11(c) and 11(d)).

After removing the glass plate 132 (FIG. 12(a)), the rear electrode 116 and the BSF region 113 are formed on the rear surface of the active layer 141 (FIG. 12(b)), completing the thin-film solar cell 103.

According to the third embodiment of the present invention, since the pyramidal projections of (111) planes are present on the surface of the active layer 141, the reflection loss of the incident light is significantly reduced. In addition, the optical path length in the active layer is increased due to the refraction of the incident light at the surface, significantly increasing the light absorption in the active layer.

FIG. 9(b) is a sectional view illustrating a thin-film solar cell according to a variation of the thin-film solar cell of FIG. 9(a). The thin-film solar cell of FIG. 9(b) includes an active layer 141a having a plurality of pyramidal projections on both of the front and rear surfaces, which projections increase the optical path length of incident light in the active layer 141a. Other structures are identical to those of the solar cell of FIG. 9(a).

Figure 13:
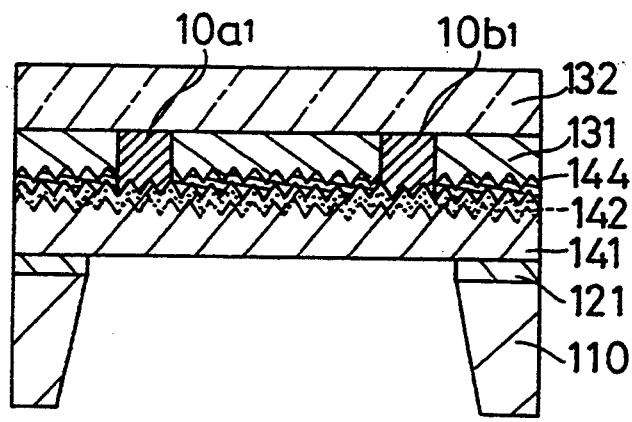
FIGS. 13(a)-13(c) are sectional views illustrating process steps of texturing the rear surface in the method for producing the thin-film solar cell of FIG. 9(b).
Figure 13:
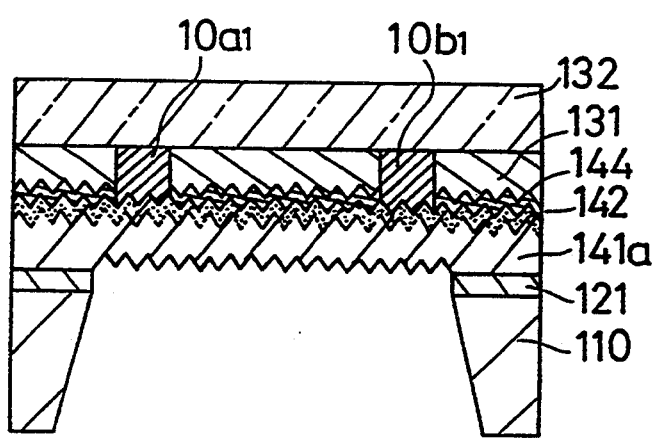
Figure 13:
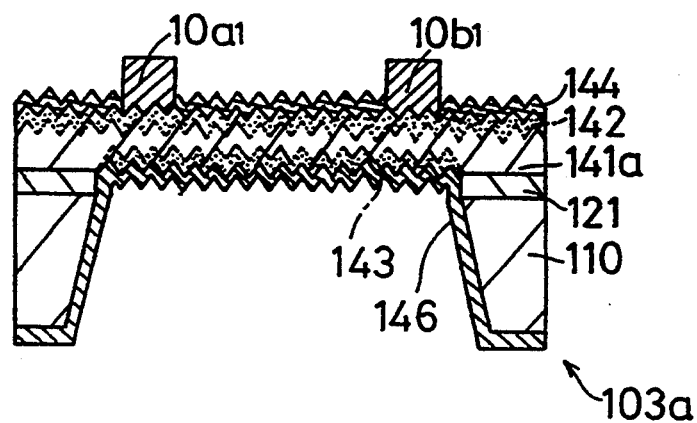

The production process is illustrated in FIGS. 13(a)-13(c). After forming the supporting substrate 110 by selectively etching the low purity substrate 109 and the insulating film 121a (FIG. 13(a)), the rear surface of the active layer 141a is subjected to an etching process using a mixture of alkali, such as KOH or NaOH, and water, forming a plurality of pyramidal projections of (111) planes on the rear surface of the active layer 141a (FIG. 13(b)).

To complete the thin-film solar cell of FIG. 9(b), the glass plate 132 is removed and the rear electrode 146 and the BSF region 143 are produced as shown in FIG. 13(c).

According to this variation, both of the front and rear surfaces of the active layer 141a have a plurality of pyramidal projections of (111) planes, and the optical path length of light reflected by the rear electrode 146 in the active layer is increased, further increasing the light absorption in the active layer.

FIGS. 14(a)-14(c) and 15(a)-15(c) are sectional views illustrating process steps in a method for producing a thin-film solar cell in accordance with a fourth embodiment of the present invention. While in the above-described first embodiment the zone melting and recrystallization of the active layer is carried out on the low purity substrate 109, in this fourth embodiment it is carried out on a carbon base having a small impurity diffusion coefficient. In the figures, the same reference numerals as those in FIGS. 2(a)-2(d), 3(a)-3(c), and 4(a)-4(b) designate the same or corresponding parts.

Figure 14:
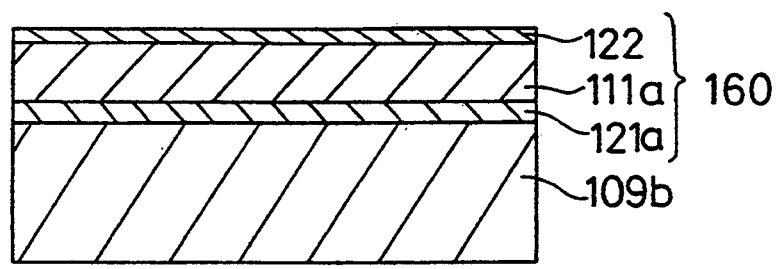
FIGS. 14(a)-14(c) are sectional views illustrating process steps in a method for producing a thin-film solar cell according to a fourth embodiment of the present invention.
Figure 14:
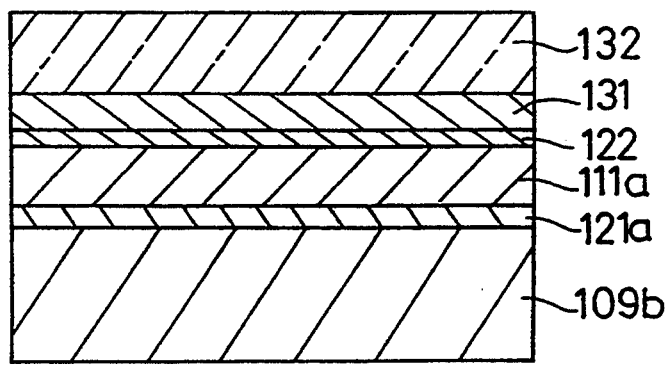
Figure 14:
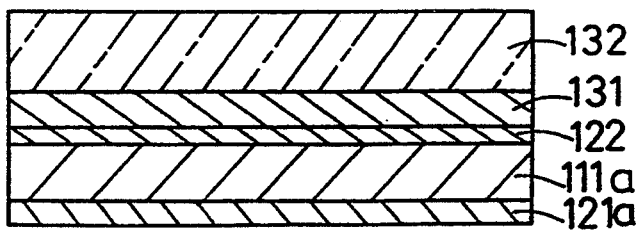

In the step of FIG. 14(a), an SiO layer 121a, a high purity Si layer 111a, and an SiO or SiN cap layer 122 are successively deposited on a first low purity substrate 109b including a lot of impurities. The laminated layers 121a, 111a, and 122 are hereinafter referred to as a laminated structure 160. Then, a supporting plate 132 is adhered to the cap layer 122 using wax 131 (FIG. 14(b)), and the first low purity substrate 109b on the rear surface is removed by etching (FIG. 14(c)).

Figure 15:
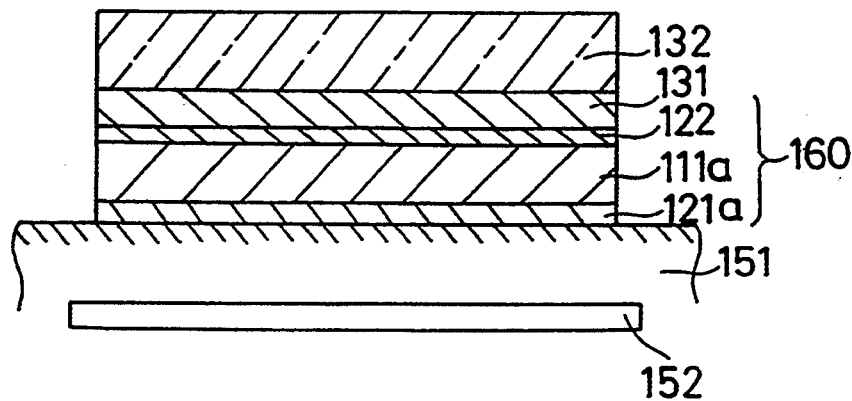
FIGS. 15(a)-15(c) are sectional views illustrating process steps in the method for producing a thin-film solar cell according to the fourth embodiment of the present invention.
Figure 15:
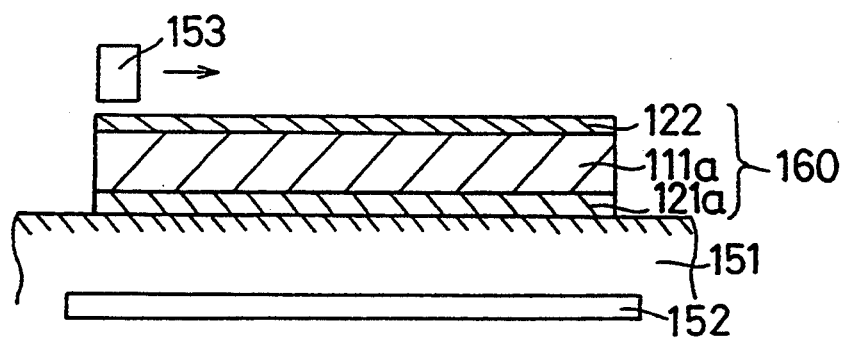
Figure 15:
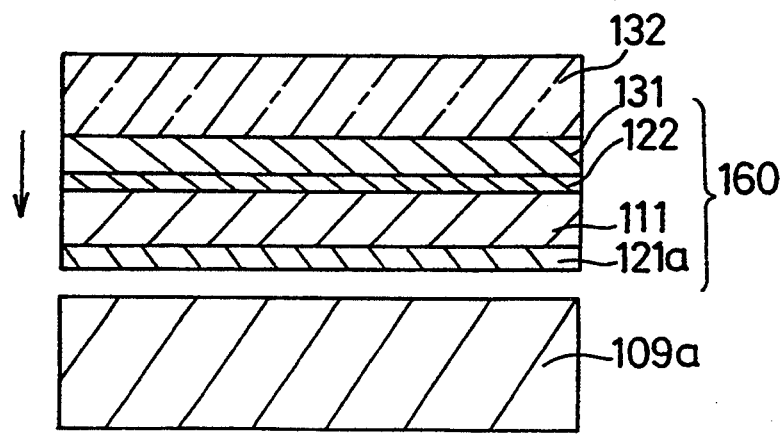

The laminated structure 160 is then placed on a carbon base 151 having a low impurity diffusion coefficient (FIG. 15(a)). After removing the supporting plate 132 from the cap layer 122, the laminated structure 160 is heated from the rear surface using a fixed lower heater 152, and a movable upper strip heater 153 is moved along the direction indicated by the arrow, whereby the crystal grain size of the Si thin layer 111a is increased by zone melting and recrystallization (ZMR), resulting in an active layer (FIG. 15(b)).

The laminated structure 160 after the ZMR process is then fixed on a second low purity substrate 109a (FIG. 15(c)). After removing the supporting plate 132 and the cap layer 122, a thin-film solar cell is completed through the front surface process steps shown in FIGS. 2(c) and 2(d) and the rear surface side process steps shown in FIGS. 3(a)-3(c) and 4(a)-4(b).

According to the fourth embodiment of the present invention, since high temperature processing of the active layer is carried out on the carbon base 151, a low purity material cheaper than that used in the first embodiment can be used for the supporting substrates 109a and 109b.

While in the above-described first to fourth embodiments the SiO film or the SiN film is employed for the insulating barrier layer, a heat resistant insulating film, such as a BN film or a TiB$_2$ film, or a laminate of these films may be employed.

FIGS. 16(a)-16(d) are sectional views illustrating process steps of forming an aperture in an AR film of a thin-film-solar cell in accordance with a fifth embodiment of the present invention.

In the figures, reference numeral 301 designates a Si substrate. A p-n junction active region 301a is disposed within the Si substrate 301, reaching the surface of the substrate. An AR film 310 is disposed on the Si substrate 301. The AR film 310 comprises a lower AR film 302 comprising SiN having a refractive index smaller than that of Si and an upper AR film 303 comprising SiO$_2$ having a refractive index smaller than that of SiN. The upper AR film 303 serves as a mask when the lower AR film 302 is etched with heated phosphoric acid. During the etching, the SiN lower AR film 302 is etched at an etching rate several times as high as that of the upper AR film 302. The thickness required for the upper AR film of a completed solar cell is about 800 Å, and about 400 Å of the upper AR film is etched away during etching of the lower AR film 302 with heated phosphoric acid. Therefore, the SiO$_2$ film 303 serving both as the etching mask and the AR film should be thicker than 1200 Å. A printed photoresist pattern 304 having an aperture 304a serves as a mask for patterning the underlying upper AR film 303. The aperture 304a is positioned opposite a region where a surface electrode 311 is to be formed. A description is now given of the production process.

Initially, the lower AR film 302 comprising SiN is deposited to a thickness of about 800 Å on the photosensitive surface of the Si substrate 301 having the p-n junction active region 301a, and the upper AR film 303 comprising SiO$_2$ is deposited on the lower AR film 302 to a thickness of about 1200 Å. Then, the photoresist film 304 is printed on the upper AR film 303 and the aperture 304a is formed opposite a region 301b where the surface electrode is to be formed (FIG. 16(a)).

Figure 16:
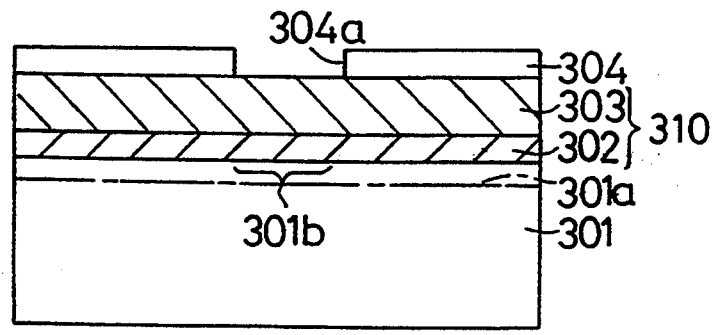
FIGS. 16(a)-16(d) are sectional views illustrating process steps of forming an AR film in a method for producing a thin-film solar cell according to a fifth embodiment of the present invention.
Figure 16:
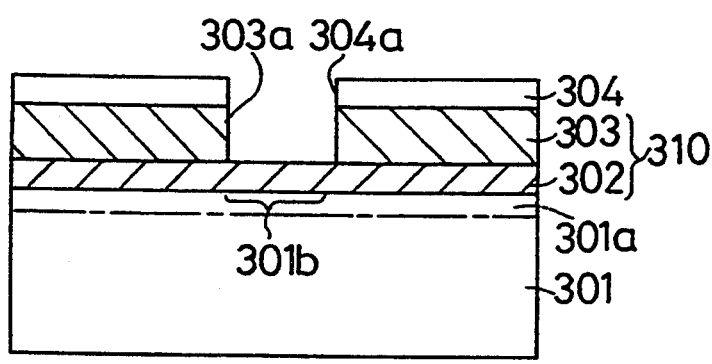
Figure 16:
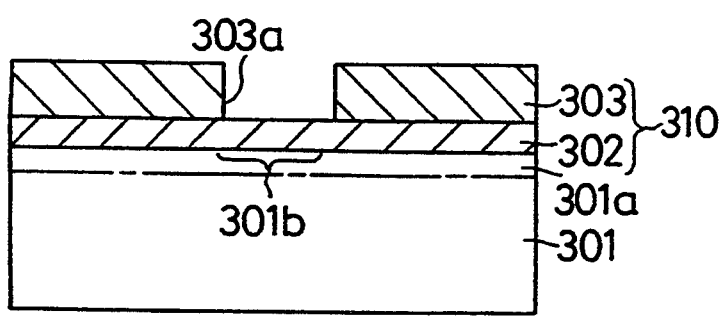
Figure 16:
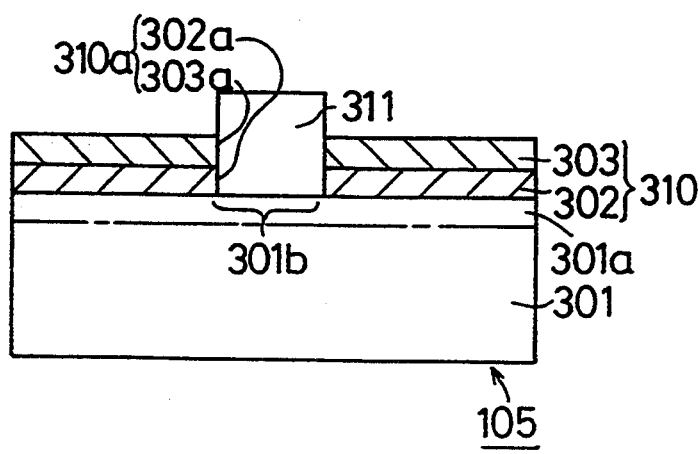

Using the photoresist pattern 304 as a mask, the upper AR film 303 comprising SiO$_2$ is etched with diluted hydrogen fluoride, forming an aperture 303a (FIG. 16(b)).

After removing the photoresist pattern 304 with a specific solvent (FIG. 16(c)), using the patterned SiO$_2$ upper AR film 303 as a mask, the SiN lower AR film 302 is etched with heated phosphoric acid, forming an aperture 302a. Thus, an aperture 310a is formed penetrating through a portion of the AR film of two-layer structure 310. Finally, the surface electrode 311 is formed on the portion of the Si substrate exposed in the aperture 310a, completing the thin-film solar cell 105 (FIG. 16(d)).

According to the fifth embodiment of the present invention, the selective etching of the lower AR film 302 is carried out using the upper AR film 303 as a mask. Therefore, the step of removing the etching mask after the etching of the lower AR film 302 can be dispensed with.

Although the patterning of the upper AR film 303 uses a photoresist mask, since the surface of the upper AR film 303 is subjected to an etching process after the removal of the photoresist mask, the surface of the AR film 310 is not contaminated with the photoresist, improving the cleanliness of the surface of the AR film.

FIGS. 17(a)-17(e) illustrate process steps in a method for producing a thin-film solar cell in accordance with a sixth embodiment of the present invention. In this sixth embodiment, before the formation of the lower AR film 302, a surface passivating film 307 comprising $SiO_2$ is formed on the photosensitive surface of the semiconductor substrate 301. Other process steps are identical to those illustrated in FIGS. 16(a)-16(d).

Figure 17:
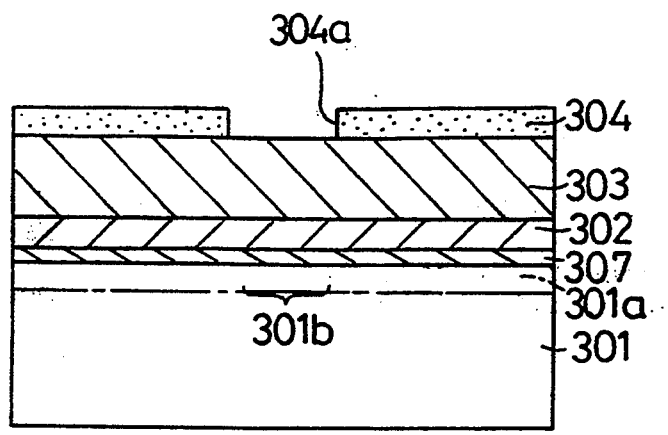
FIGS. 17(a)-17(e) are sectional views illustrating process steps of forming an AR film in a method for producing a thin-film solar cell according to a sixth embodiment of the present invention.
Figure 17:
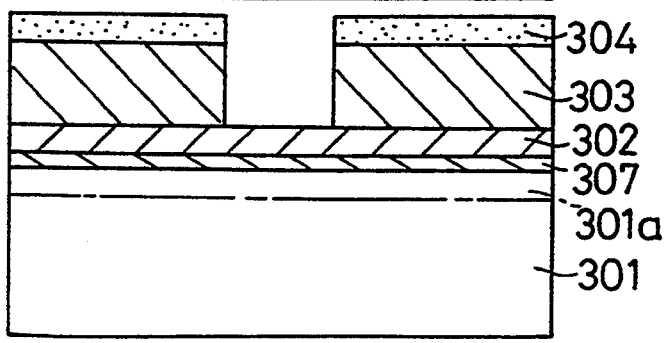
Figure 17:
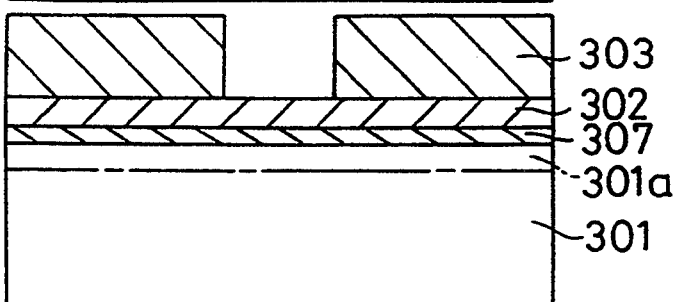
Figure 17:
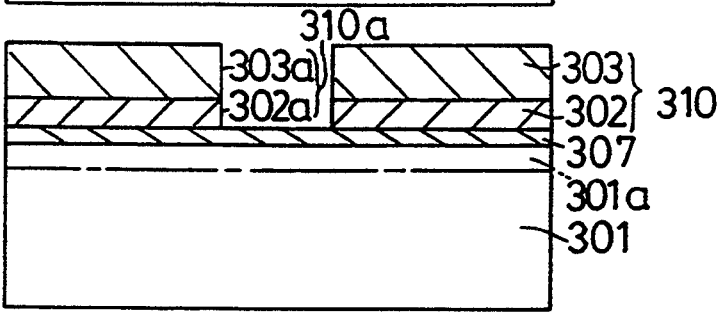
Figure 17:
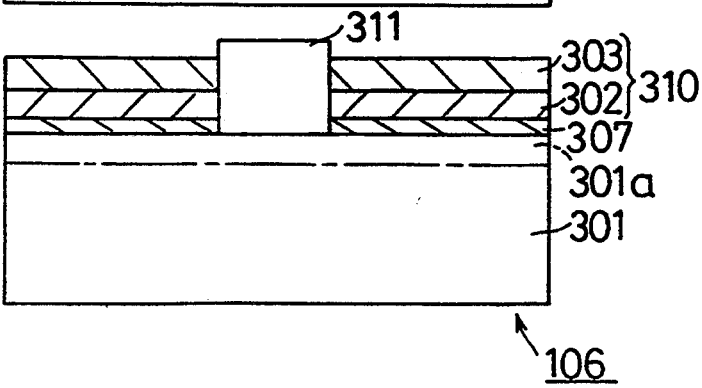

Also in this sixth embodiment, the $SiO_2$ upper AR film 303 deposited in the step of FIG. 17(a) must be thicker than the upper AR film 303 of the completed structure shown in FIG. 17(e) because it is etched in the steps of FIGS. 17(c) and 17(d). More specifically, the $SiO_2$ upper AR film 303 in the step of FIG. 17(a) must be as thick as 2000 Å because it is etched by about 400 Å in the step of etching the lower AR film 302 with heated phosphoric acid and by about 800 Å in the step of etching the surface passivating film 307 with hydrofluoric acid.

A description is now given of the production process.

In the step of FIG. 17(a), the surface passivating film 307 is formed on the photosensitive surface of the semiconductor substrate 301 having the p-n junction active region 301a. Then, the SiN lower AR film 302 about 800 Å thick and the $SiO_2$ upper AR film 303 about 2000 Å thick are successively deposited on the surface passivating film 307. Then, the photoresist film 304 is printed on the upper AR film 303 and the aperture 304a is formed in a part of the photoresist film 304 opposite a region 301b where the surface electrode is to be produced.

In the steps of FIGS. 17(b)-17(d), the upper AR film 303 and the lower AR film 302 are patterned in the same way as described in the fifth embodiment of the present invention, forming the AR film 310 having the aperture 310a.

In the step of FIG. 17(e), the surface passivating film 307 is etched using the AR film 310 as a mask to expose the surface of the p-n junction active region 301a in the aperture 310a, and the surface electrode 311 is formed on the exposed part of the active region 301a, completing the thin-film solar cell 106.

In this sixth embodiment of the present invention, since the surface of the Si substrate 301 is in contact with the $SiO_2$ surface passivating film 307, recombination at the surface of the Si substrate is reduced compared to the fifth embodiment of the present invention.

While in the above-described fifth and sixth embodiments the upper AR film comprises $SiO_2$ and the lower AR film comprises SiN, the upper AR film may comprise $MgF_2$ having a refractive index of 1.37-1.39 and the lower AR film may comprise $TiO_2$ having a refractive index of 2.2 or $Ta_2O_5$ having a refractive index of 2.15.

Figure 18:
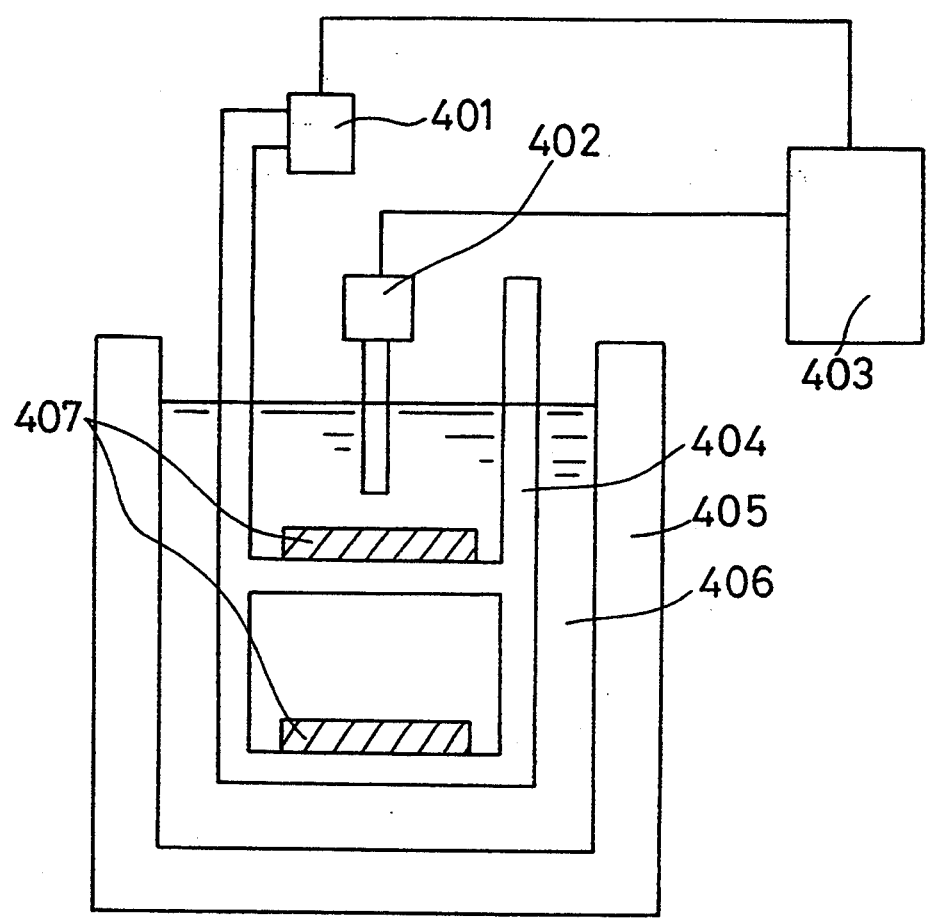
FIG. 18 is a schematic diagram illustrating an etching apparatus employed in an etching method according to a seventh embodiment of the present invention.
Figure 31:
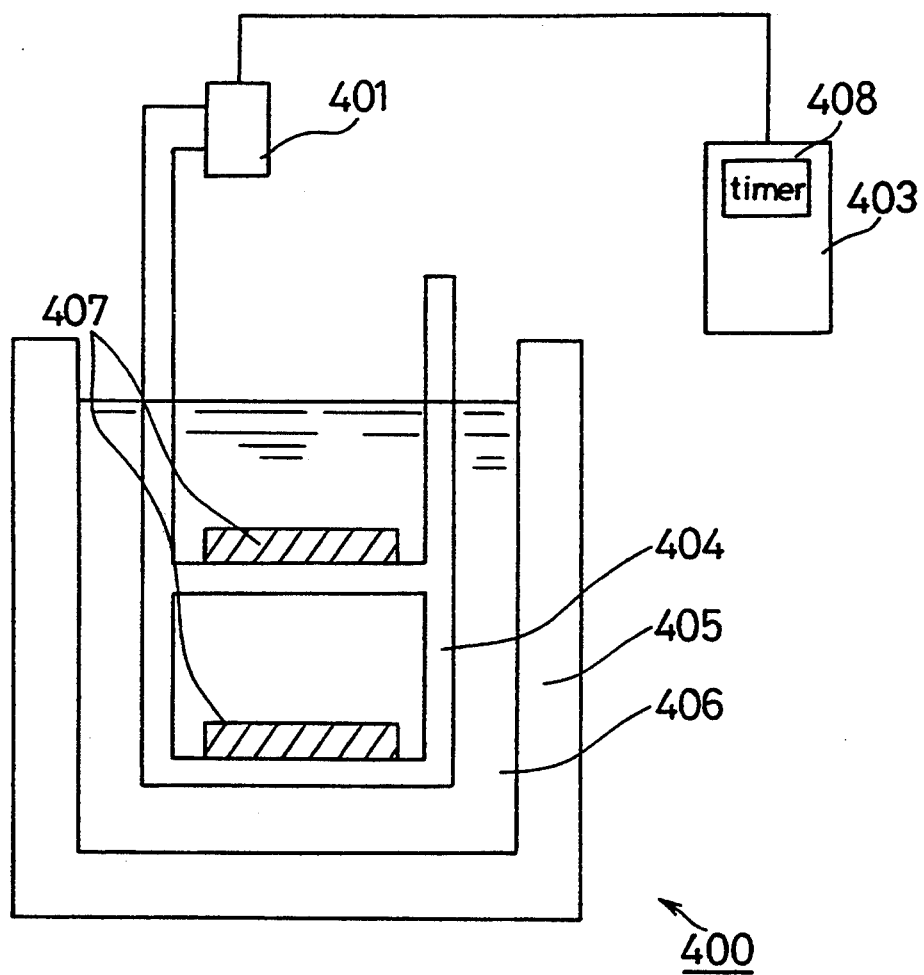
FIG. 31 is a schematic diagram illustrating an automatic etching apparatus according to the prior art.

FIG. 18 is a schematic diagram illustrating an automatic etching apparatus in accordance with a seventh embodiment of the present invention. This etching apparatus 107 is fundamentally identical to the conventional etching apparatus 400 shown in FIG. 31 except that a reflectance measuring apparatus 402 is connected to the controller 403. The reflectance measuring apparatus 402 monitors the reflectance at the surface of the sample 407 immersed in the etchant 406 and outputs a monitor signal to the controller 403. The controller 403 controls the conveyer 401 according to the monitor signal from the reflectance measuring apparatus 402.

More specifically, the controller 403 controls the conveyer 401 so that the sample container 404 is taken out from the flask 405 when a change of reflectance appears in the monitor signal. The reflectance measuring apparatus 402 includes a laser device (not shown) for irradiating the surface of the sample with laser light and a measuring apparatus (not shown) for measuring the laser light reflected at the sample surface. The reflectance at the sample surface is monitored and the monitor signal is applied to the controller 403. In addition, a KOH solution is employed as the etchant 404.

Figure 19:
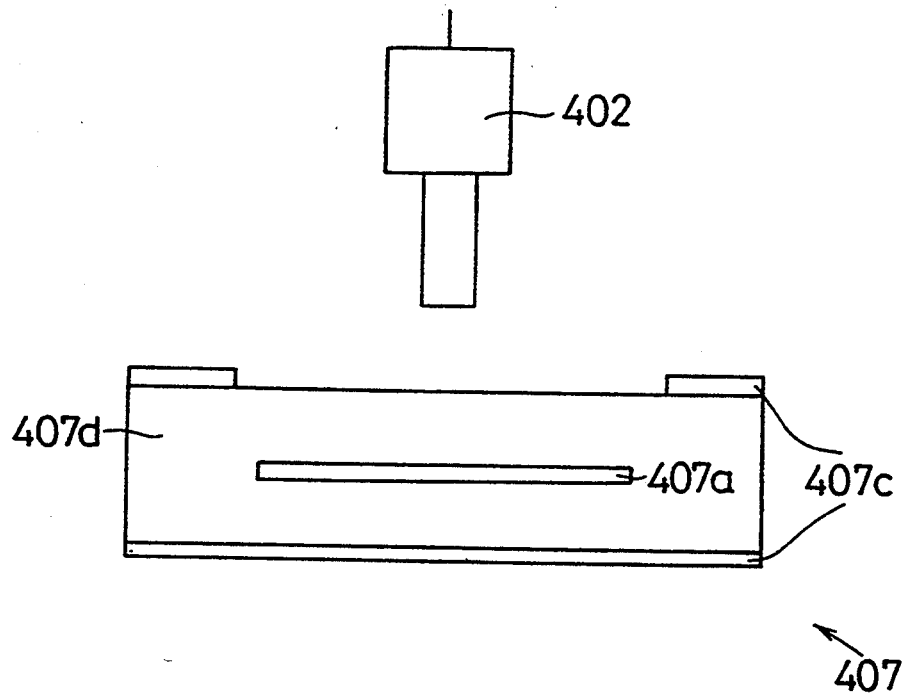
FIGS. 19(a) and 19(b) are schematic diagrams illustrating a sample wafer before and after the etching process according to the seventh embodiment of the present invention.
Figure 19:
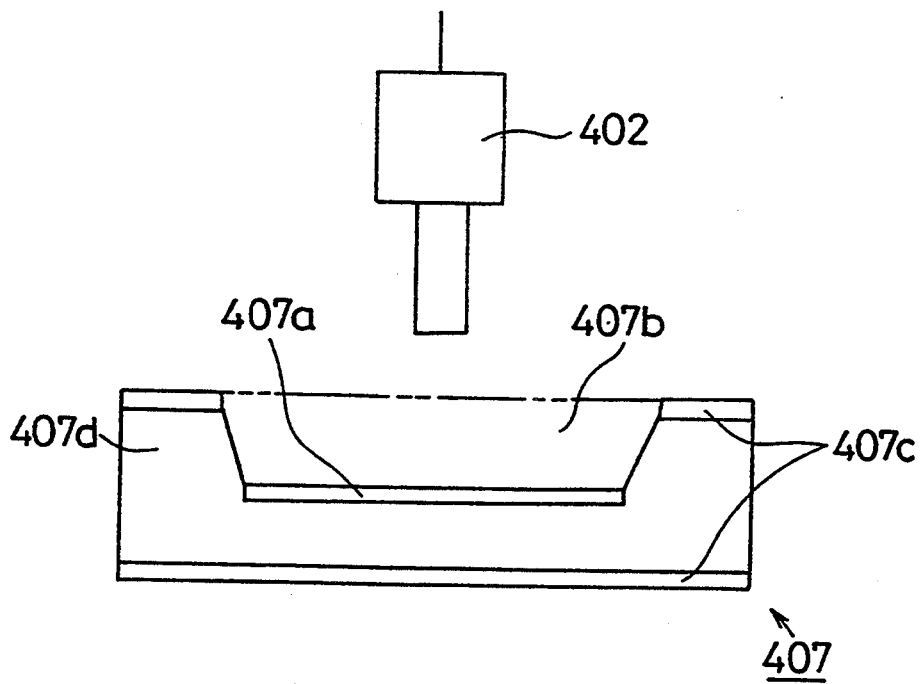

FIGS. 19(a) and 19(b) are schematic diagrams illustrating the sample 407 before and after the etching process, respectively. The sample 407 comprises a Si substrate 407d, an etch stop layer 407a comprising $SiO_2$ or the like embedded in the Si substrate, and protective films 407c comprising $Si_3N_4$ or the like disposed on the rear surface of the substrate 407d and on prescribed portions of the front surface of the substrate.

In FIG. 19(b), a groove 407b is formed by selectively etching away a portion of the Si substrate 407d using the protective films 407c on the front surface as a mask. The etch stop layer 407a is exposed at the bottom of the groove 407b.

A description is now given of the operation of the automatic etching apparatus.

First, the sample 407 shown in FIG. 19(a) is put in the sample container 404. When the etching apparatus 107 is started, the sample container 404 is conveyed by the conveyer 401 and immersed in the etchant 406 in the flask 405. At the same time, the reflectance measuring apparatus 402 starts monitoring the light reflected at the surface of the sample 407.

In the flask 405, the exposed surface of the Si substrate 407d is etched with the KOH solution at 70°-80° C. until the etch stop layer 407a embedded in the substrate is exposed as shown in FIG. 19(b). When the etch stop layer 407a is exposed, the reflectance of the laser light of 1 μm wavelength at the etching front surface changes from about 30%, that is the reflectance at the surface of the Si substrate, to about 50% that is the reflectance at the surface of the $SiO_2$ etching stopper layer 407a. This change of reflectance is detected by the reflectance measuring apparatus 402 and output to the controller 403.

Receiving the signal from the reflectance measuring apparatus 402, the controller 403 controls the conveyer 401 so that the sample container is taken out from the flask 405, whereby the etching process is completed.

According to the seventh embodiment of the present invention, a desired etching depth is always attained regardless of variations in the etching rate.

While in the above-described seventh embodiment of the present invention the SiO$_2$ etch stop layer embedded in the Si substrate is employed as a means for changing the reflectance at the etching front surface when the etching depth reaches a desired value, the means for changing the reflectance is not restricted thereto.

Figure 20:
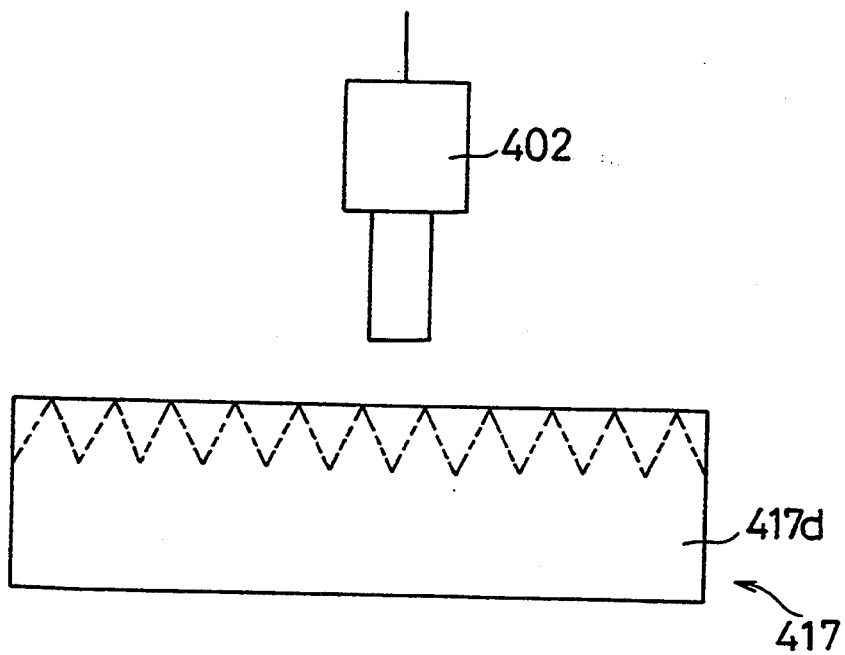
FIGS. 20(a) and 20(b) are schematic diagrams for explaining an etching method according to an eighth embodiment of the present invention.
Figure 20:
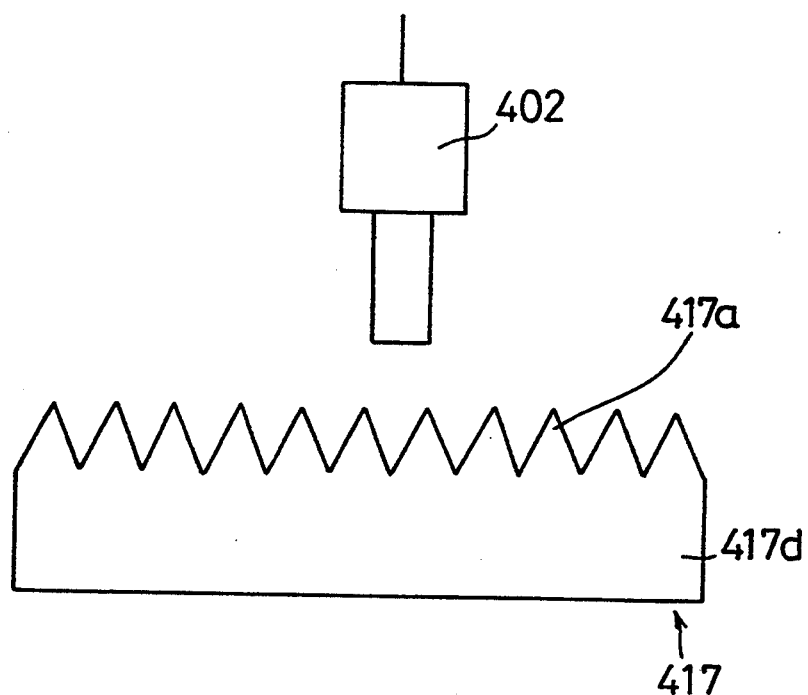

FIGS. 20(a) and 20(b) are schematic diagrams for explaining an etching method in accordance with an eighth embodiment of the present invention, in which FIGS. 20(a) and 20(b) illustrate samples before and after the etching process, respectively.

In the figures, the sample 417 comprises a Si substrate 417d having a (100) surface orientation. A textured surface 417a is attained by etching the (100) surface of the Si substrate 417d with an etchant having a surface orientation selectivity, such as hydrazine (N$_2$H$_4$), on which (111) planes of the Si substrate 417d are exposed forming a plurality of pyramidal projections. The reflectance of 1 $\mu$m wavelength laser light of the textured surface 417a is about 10% while the reflectance of the light of the (100) surface is about 30%.

A description is now given of the operation.

When the container 404 containing the sample 417 shown in FIG. 20(a) is immersed in the etchant 406, such as hydrazine, the etching of the Si substrate 417d of the (100) surface is started. Since the etchant 406 has a selectivity with respect to the (111) plane, the etching proceeds exposing the (111) planes of the Si substrate and, after a prescribed etching time, a plurality of pyramidal projections are formed on the surface of the Si substrate, i.e., the textured surface 417a is attained. At this time, the reflectance at the etching front surface changes from 30% to 10% and this change of reflectance is detected by the reflectance measuring apparatus 402 and output to the controller 403. Receiving the signal from the reflectance measuring apparatus 402, the controller 403 controls the conveyer 401 so that the sample container 404 is taken out of the flask 405, completing the etching process.

According to the eighth embodiment of the present invention, a desired etching depth is always attained regardless of variations in the etching rate.

While in the above-described seventh and eighth embodiments the conclusion of the etching process is detected by a change in reflectance at the etching front surface, it may be detected by the change of light transmittance in the etchant.

Figure 21:
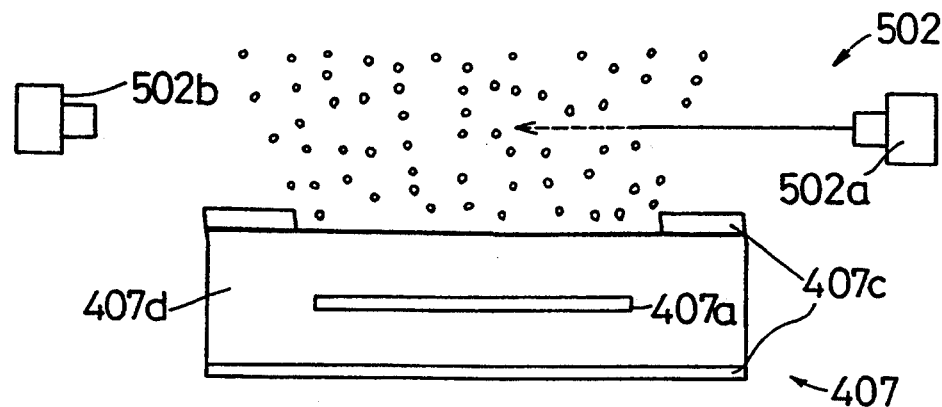
FIGS. 21(a)-21(c) are schematic diagrams for explaining an etching apparatus used in an etching method according to a ninth embodiment of the present invention.
Figure 21:
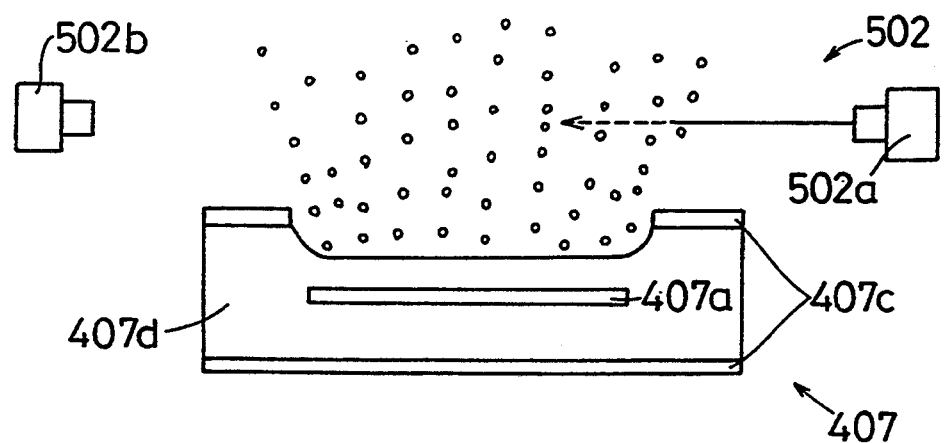
Figure 21:
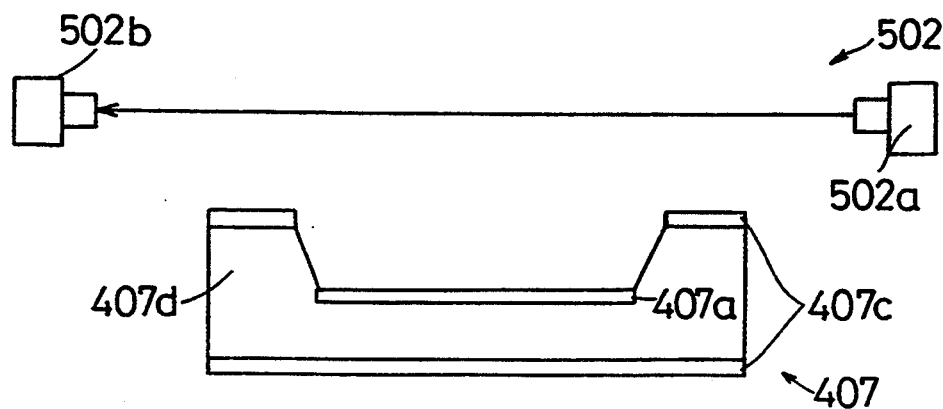

FIGS. 21(a)-21(c) are schematic diagrams for explaining an etching method in accordance with a ninth embodiment of the present invention. In an ordinary etching process, a lot of bubbles are produced from the etching front surface, which bubbles significantly reduce the light transmittance in the etchant. In this ninth embodiment, the conclusion of the etching is detected by the generation of the bubbles, i.e., the change of light transmittance in the etchant.

The automatic etching apparatus used in this ninth embodiment includes a transmittance detecting apparatus 502 for monitoring the light transmittance of the etchant in place of the reflectance measuring apparatus 402 according to the seventh and eighth embodiments, and the conclusion of the etching process is detected by a change of the light transmittance in the etchant. The transmittance detecting apparatus 502 comprises a laser device 502a emitting laser light parallel to the surface of the sample 407 and a light receiving apparatus 502b detecting the laser light. The laser device 502a and the detecting apparatus 502b are opposite each other with the sample 407 between them.

A description is now given of the operation.

When the container 404 containing the sample 407 of the same structure as that shown in FIG. 19(a) is immersed in the etchant 406 in the flask 405, the etching of the sample 407 is started. The light transmittance in the etchant 406 is significantly reduced due to a lot of bubbles produced from the etching surface of the sample 407. When the etch stop layer 407a is exposed, the etching stops and no bubbles are produced from the surface, whereby the light transmittance is significantly changed. This change of light transmittance is detected by the detector 502 and output to the controller 403. Receiving the signal from the detector 502, the controller controls the conveyer 401 so that the sample container 404 is taken out of the flask 405, completing the etching process.

According to the ninth embodiment of the present invention, a desired etching depth is always attained regardless of variations in the etching rate.

In the step of selectively etching the rear surface of the substrate of a semiconductor device, such as the step of forming the aperture in the Si substrate from the rear surface according to the first to fourth embodiments of the present invention, it is necessary to fix the sample, such as a thin-film solar cell, to a sample holder using wax or the like. However, this step is very complicated and the surface of the sample is unfavorably contaminated with the wax.

This problem will be described in more detail with respect to the method for producing a thin-film solar cell according to the first embodiment of the present invention. FIGS. 22(a)-22(g) are sectional views illustrating process steps of forming an aperture on the rear surface of the substrate. In the figures, the same reference numerals as those in FIGS. 1(a)-1(b), 2(a)-2(d), 3(a)-3(c), and 4(a)-4(b) designate the same or corresponding parts. Reference numeral 109 designates a low-cost substrate, such as MG-Si. An SiO film 121a is disposed on the low-cost substrate 109. A thin Si layer 111 having a p-n junction is disposed on the SiO film 121a. A junction formation region 112 is disposed within the Si layer 111, reaching the surface thereof. Reference numeral 115 designates a SiN film serving as an etching mask for protecting the substrate 109 from the etchant, such as KOH.

In addition, reference numeral 170a designates a sample before the etching process. Reference numeral 131 designates a protective wax for protecting the front and side surfaces of the sample 170a from the etchant. The sample 170a is adhered to a sample holder 132 via the wax 131. Preferably, the sample holder 132 comprises quartz or stainless steel.

Figure 22:
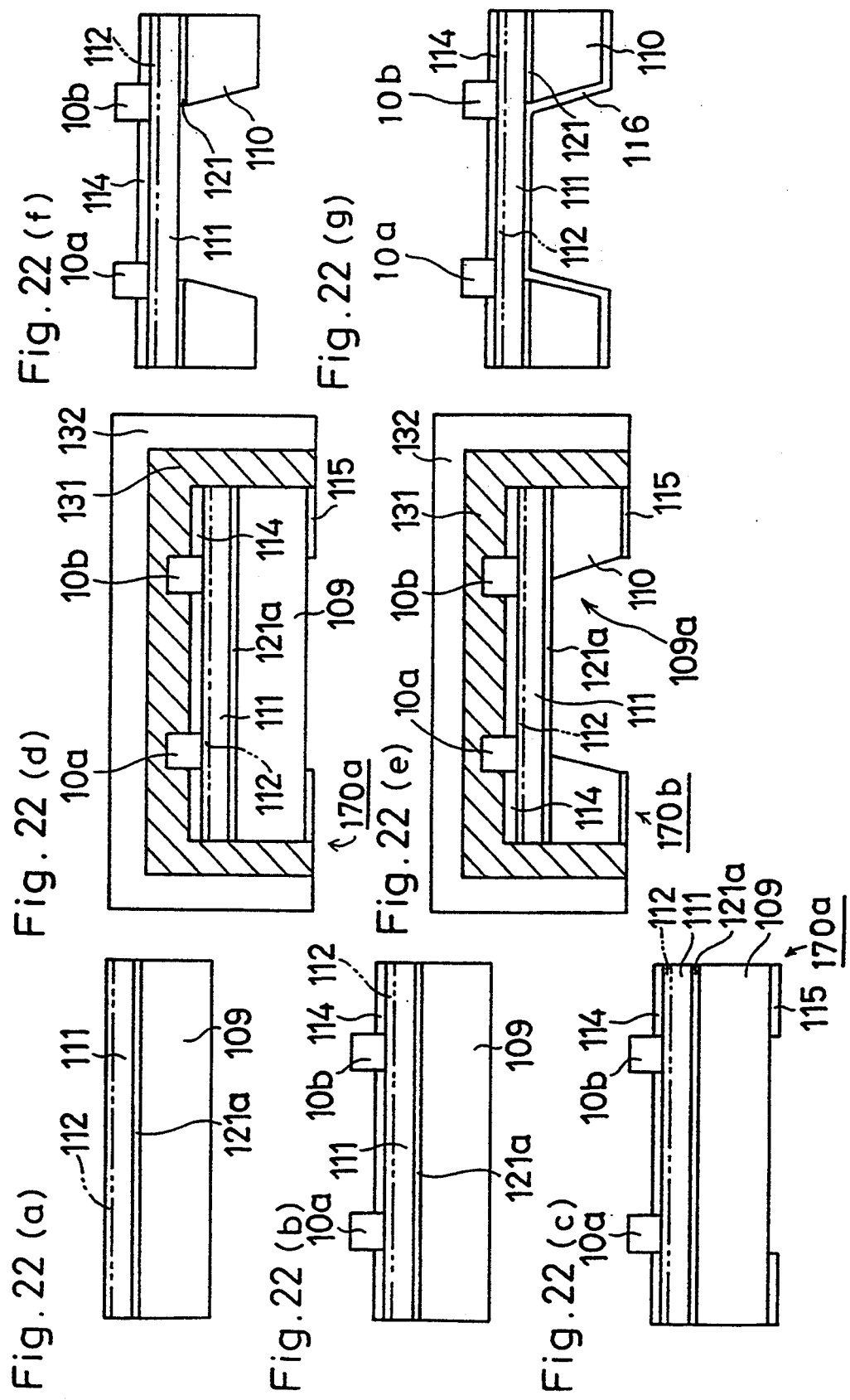
FIGS. 22(a)-22(g) are sectional views for explaining problems in a conventional etching process.

The process steps illustrated in FIGS. 22(a)-22(c) are identical to those already described with respect to FIGS. 2(a)-2(d) and, therefore, do not require repeated description.

The sample 170a shown in FIG. 22(c) is adhered to the sample holder 132, which is a little larger than the sample 170a, using the protective wax 131 (FIG. 22(d)).

Then, the sample holder 132 with the sample 170a is put in a sample container (not shown) and the container is immersed in the KOH solution. In the KOH solution, a portion of the substrate 109 that is not masked with the etching mask 115 is selectively etched from the rear surface. The etching is stopped when the SiO film 121a is exposed, resulting in the sample 170b shown in FIG. 22(e).

Then, the wax 131 is softened by heating, and the sample 170b is disconnected from the holder 132 using mechanical force. Thereafter, the surface of the sample 170b is washed to remove the wax 131.

The thin-film solar cell 101 is completed through the process steps shown in FIGS. 22(f) and 22(g) which are identical to the process steps shown in FIGS. 4(a) and 4(b).

In the above-described process for forming the aperture in the substrate from the rear surface, however, complicated process steps are required, i.e., the step of adhering each sample to the sample holder using wax, the step of disconnecting the sample from the sample holder by softening the wax, and the step of washing the surface of the sample to remove the wax.

In addition, the wax is not completely removed by the washing, so that the surface of the sample is contaminated with the wax.

Figure 23:
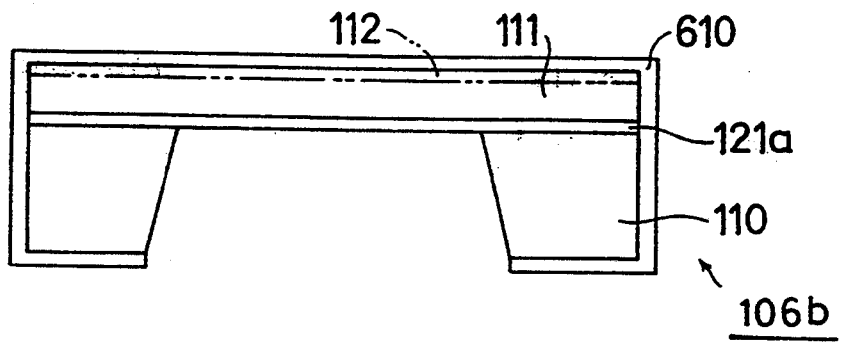
FIGS. 23(a)-23(c) are sectional views illustrating sample wafers subjected to etching processes according to tenth and eleventh embodiments of the present invention compared to a sample wafer subjected to the conventional etching process.
Figure 23:
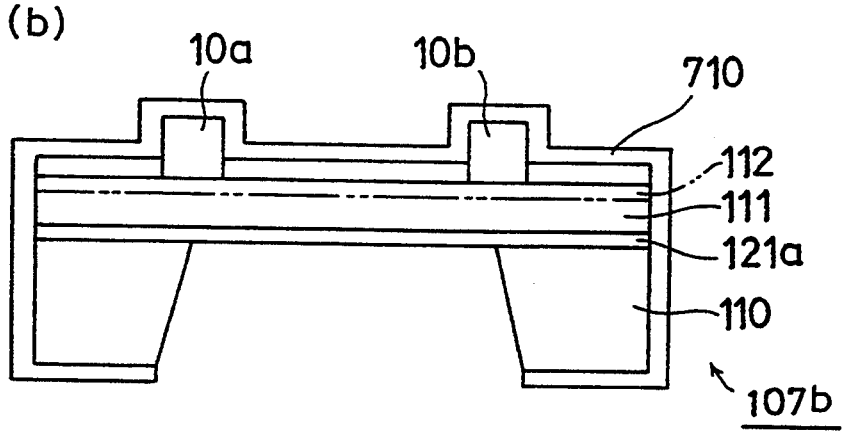
Figure 23:
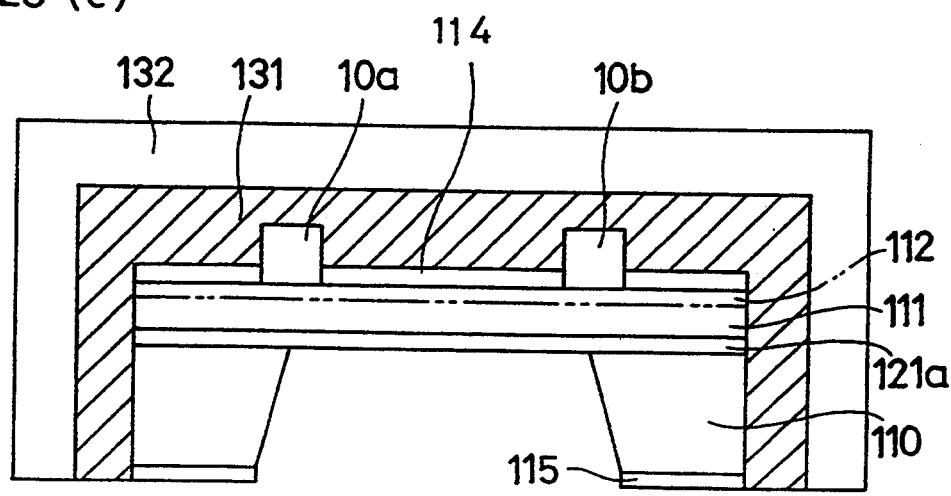

FIGS. 23(a) and FIGS. 24(a)–24(e) illustrate a method for producing a thin-film solar cell in which the above-described problems are solved. FIGS. 24(a)–24(e) are sectional views illustrating process steps in the method and FIG. 23(a) is a sectional view illustrating the sample just after the etching process.

In these figures, the same reference numerals as in FIGS. 22(a)–22(g) designate the same or corresponding parts. Reference numeral 106a designates a sample before the etching process. The sample comprises a low-cost substrate 109, an SiO film 121a disposed on the low-cost substrate 109, a thin active layer 111 disposed on the SiO film 121a, and a junction formation region 112 disposed within the Si layer 111 and reaching the surface thereof. A SiN film 610 is disposed on the front and side surfaces of the sample and on a part of the rear surface of the sample.

Reference numeral 106b designates the sample after the etching process, in which an aperture 109a is formed in a region where the SiN film 610 is absent.

A description is now given of the production process.

Figure 24:
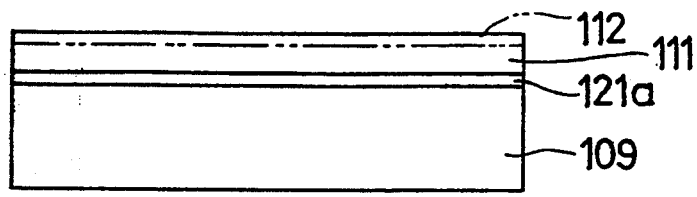
FIGS. 24(a)-24(e) are sectional views illustrating the etching process according to the tenth embodiment of the present invention.
Figure 24:
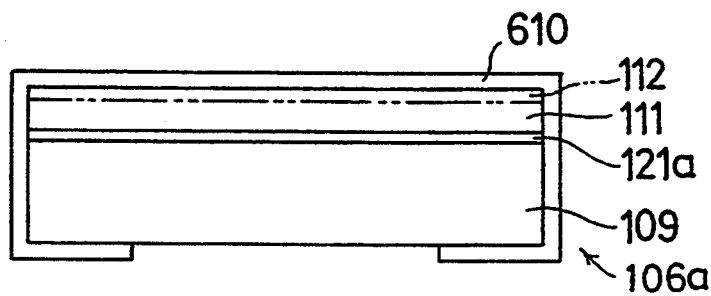
Figure 24:
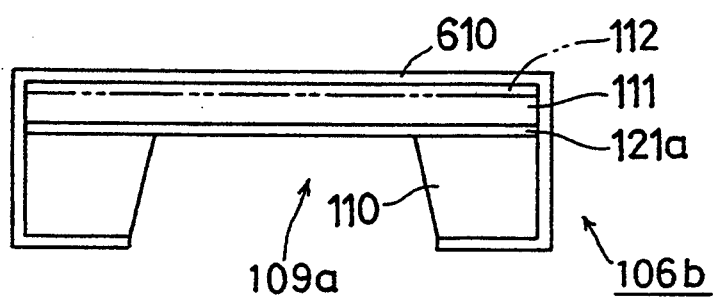
Figure 24:
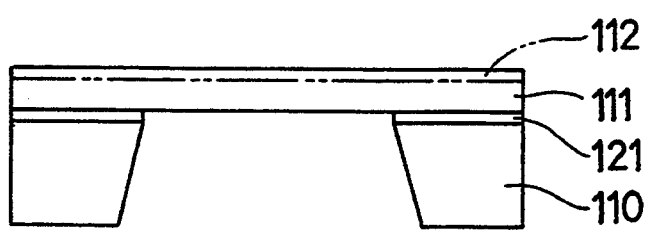
Figure 24:
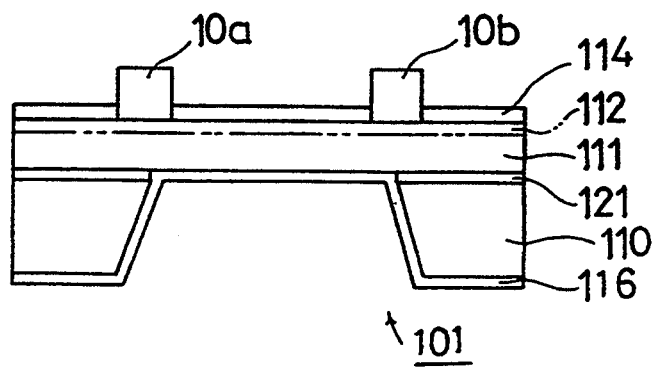

Initially, the SiO film 121a and the polycrystalline Si thin film 111 are deposited on the low-cost substrate 109, and the junction formation region 112 is formed within the thin Si layer 111 and reaching the surface thereof (FIG. 24(a)). Thereafter, the structure of FIG. 24(a) is covered with the SiN film 610 except for a region on the rear surface of the substrate 109 where the aperture is to be formed, resulting in the sample 106a before the etching process (FIG. 24(b)).

Then, the sample 106a is put in a container (not shown) and the container is immersed in an etchant, such as KOH. In the etchant, a portion of the low-cost substrate 109 which is not masked with the SiN film 610 is selectively etched away, forming the aperture 109a. The etching is stopped when the SiO film 121a is exposed in the aperture 109a. Thus, the sample 106b shown in FIG. 24(c) is produced.

The SiN film 610 and a portion of the SiO film 121a exposed in the aperture 109a are removed using heated phosphoric acid and hydrofluoric acid, respectively (FIG. 24(d)). Thereafter, the AR film 114, the surface electrodes 10a and 10b, and the rear electrode 116 comprising Al or the like are produced according to the same process steps as described with respect to FIGS. 4(a)–4(b), completing the thin-film solar cell 101 shown in FIG. 24(e).

According to the tenth embodiment of the present invention, since the front and side surfaces of the sample 106a are completely covered with the SiN film 610 during the etching process, the complicated process step of adhering the sample to the sample holder 132 with the wax can be dispensed with. In addition, the surface of the sample is not contaminated with the wax.

In the above-described production method, the aperture 109a of the substrate 110 may be formed after forming the surface electrodes 10a and 10b and the AR film 114.

A description is now given of a method for producing a thin-film solar cell according to an eleventh embodiment of the present invention, in which the aperture of the substrate is formed after the formation of the surface electrodes and the AR film. FIGS. 25(a)–25(e) are sectional views illustrating process steps in this method, and FIG. 23(b) is a sectional view illustrating a sample after the etching process.

In the figures, the same reference numerals as those in FIG. 23(a) and FIGS. 24(a)–24(e) designate the same or corresponding parts. Reference numeral 107a designates a sample before the etching process. The sample 107a comprises a low-cost substrate 109 on which a SiO film 121a, semiconductor layers 111 and 112, surface electrodes 10a and 10b, and an AR film 114 are disposed, and the structure is completely covered with a SiN film 710 except for a region on the rear surface of the substrate 109 where an aperture is to be formed.

Reference numeral 107b designates a sample after the etching process, in which an aperture 109a is formed penetrating through a portion of the low-cost substrate 109 where the SiN film 710 is absent.

A description is now given of the production process.

Figure 25:
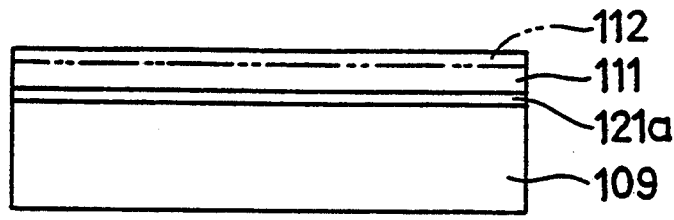
FIGS. 25(a)-25(e) are sectional views illustrating the etching process according to the eleventh embodiment of the present invention.
Figure 25:
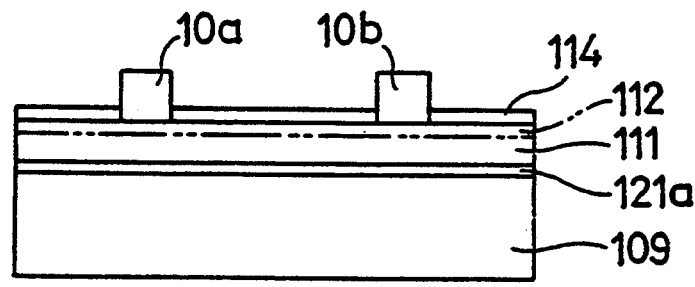
Figure 25:
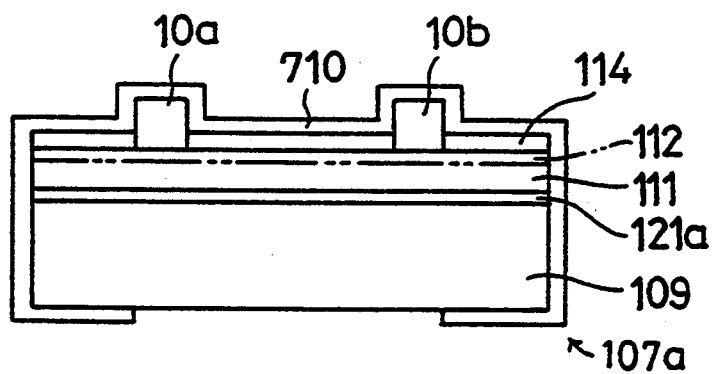
Figure 25:
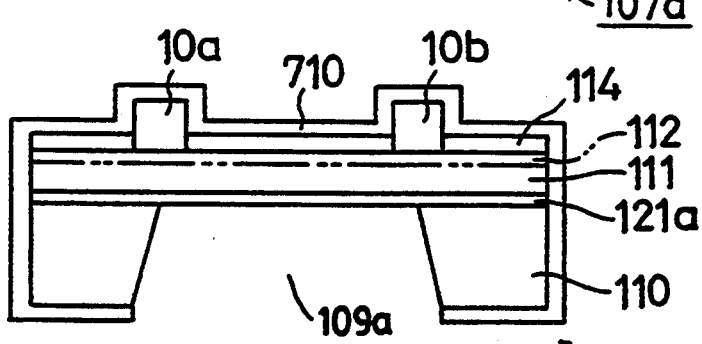
Figure 25:
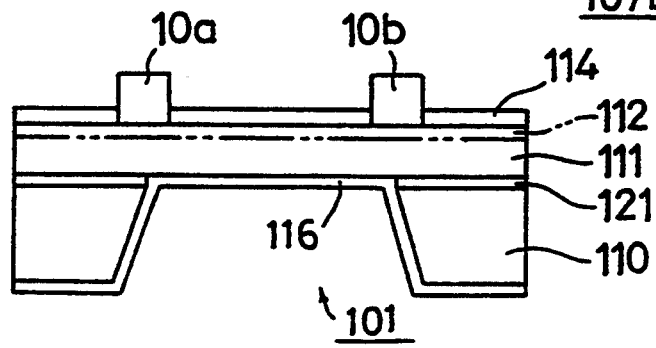
Figure 26:
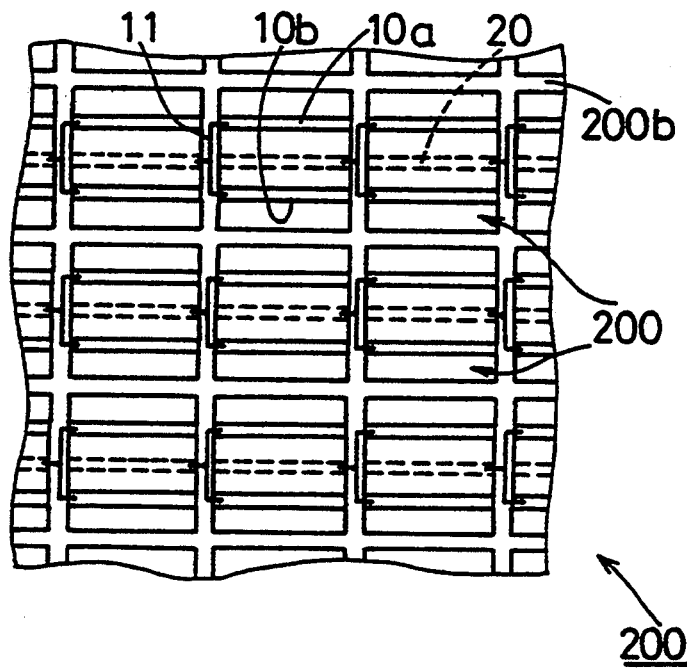
FIGS. 26(a) and 26(b) are plan views illustrating a solar cell module and a thin-film solar cell, respectively, according to the prior art.
Figure 26:
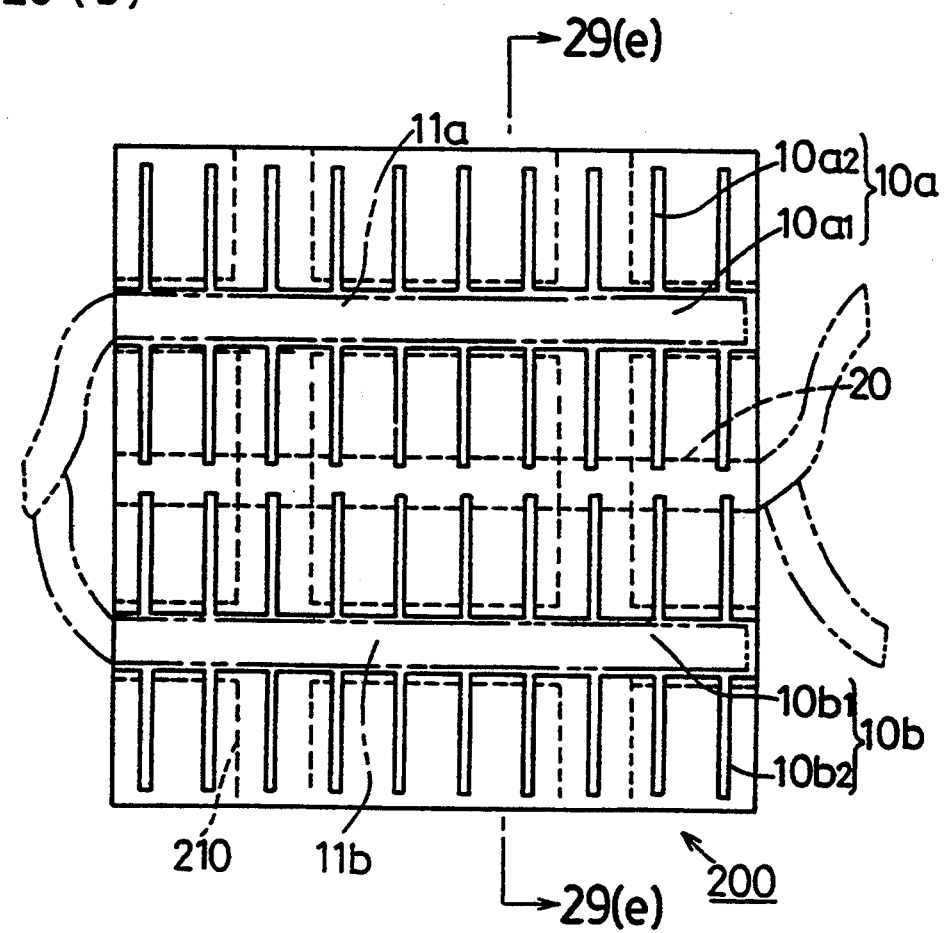
Figure 27A:
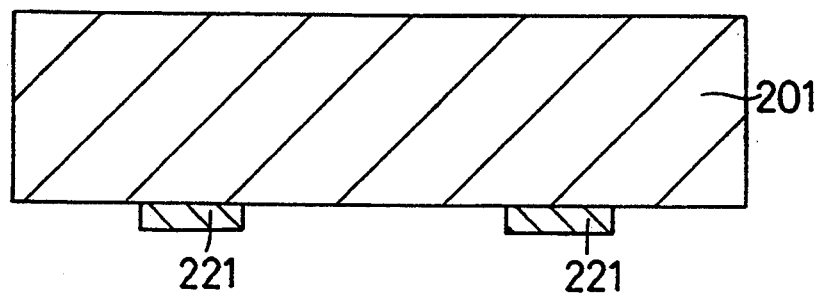
FIGS. 27(a)-27(d) are sectional views illustrating process steps in a method for producing the thin-film solar cell of FIG. 26(b).
Figure 27B:
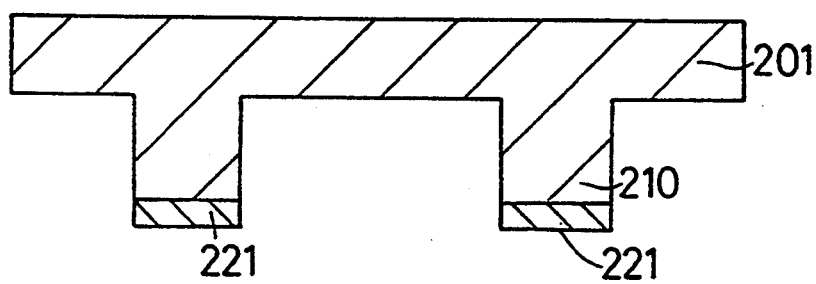
Figure 27C:
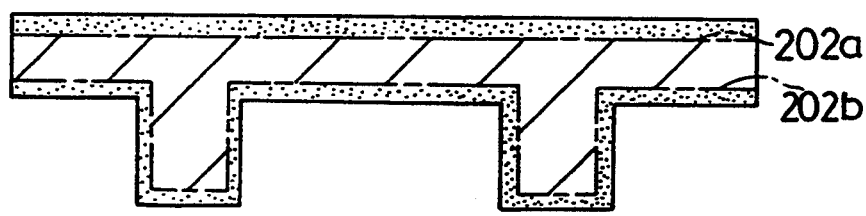
Figure 27D:
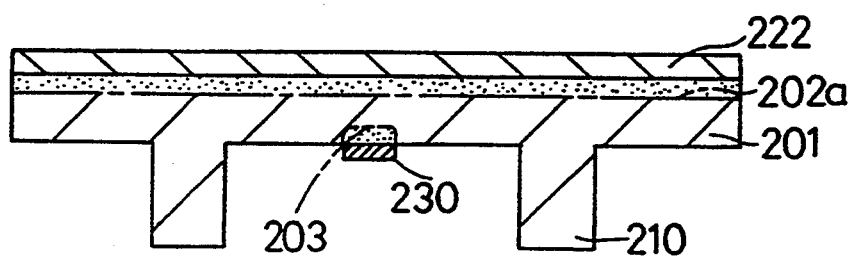
Figure 28:
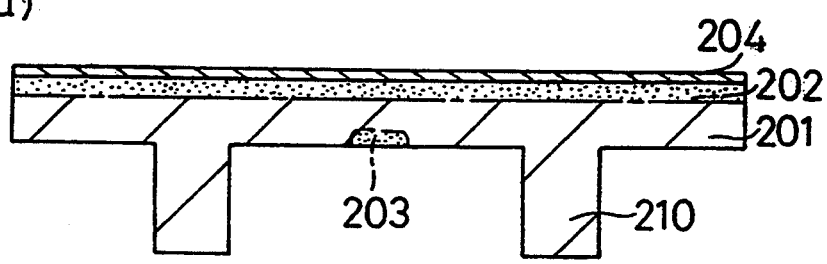
FIGS. 28(a)-28(c) are sectional views illustrating process steps in the method for producing the thin-film solar cell of FIG. 26(b).
Figure 28:
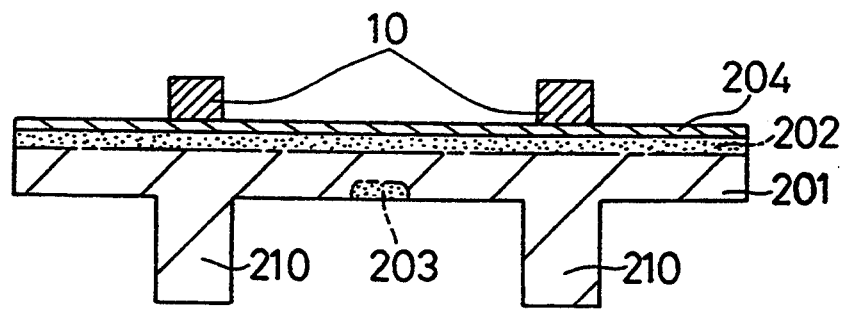
Figure 28:
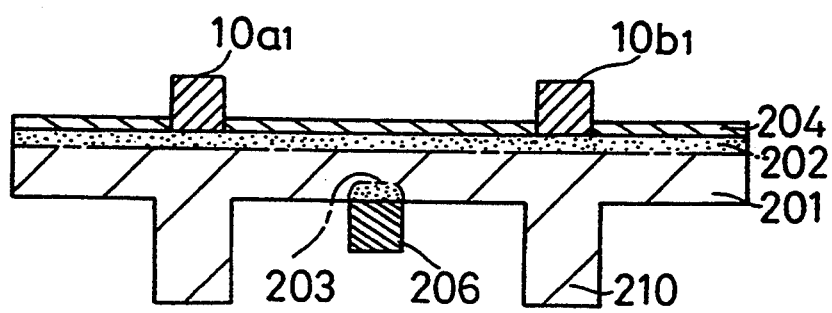
Figure 29:
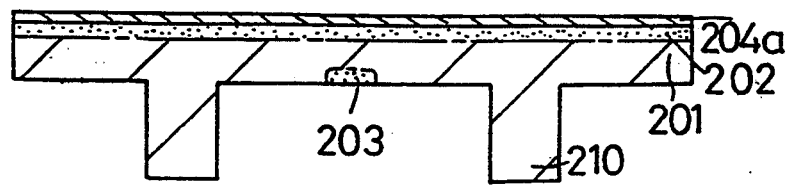
FIGS. 29(a)-29(e) are sectional views illustrating process steps in the method of producing the thin-film solar cell of FIG. 26(b).
Figure 29:
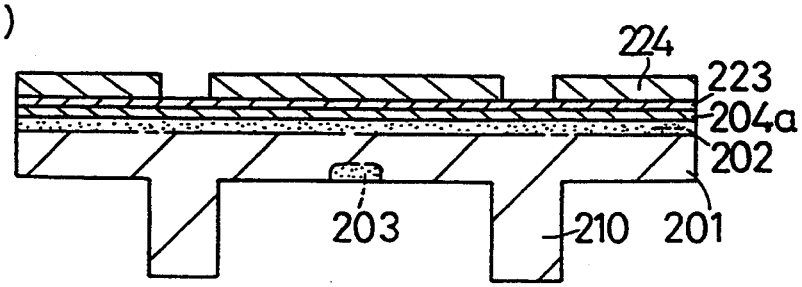
Figure 29:
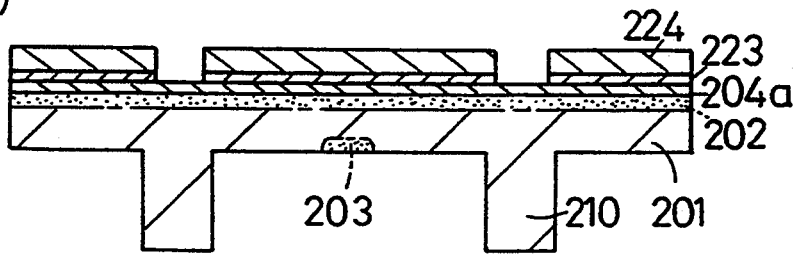
Figure 29:
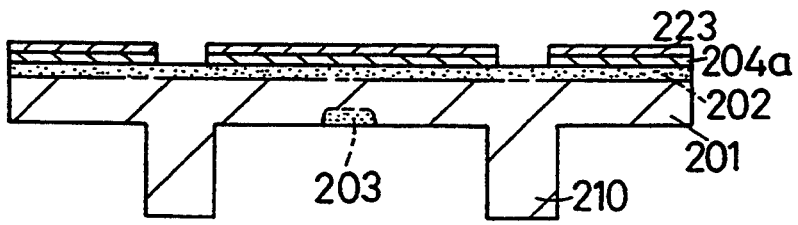
Figure 29:
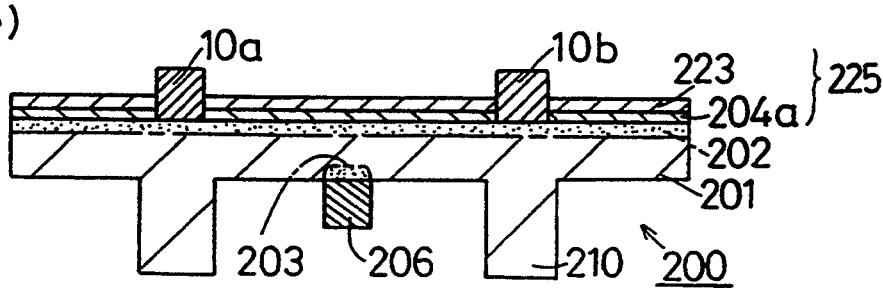
Figure 30:
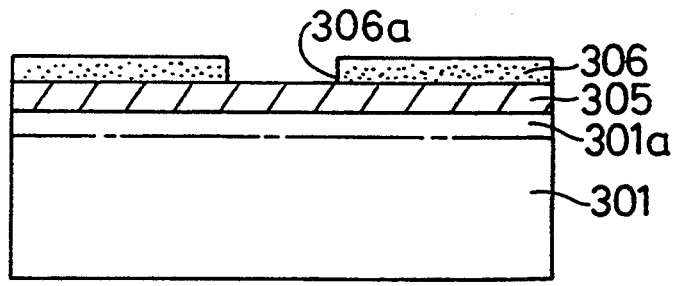
FIGS. 30(a)-30(c) are sectional view illustrating process steps of forming an AR film in a method for producing a thin-film solar cell according to the prior art.
Figure 30:
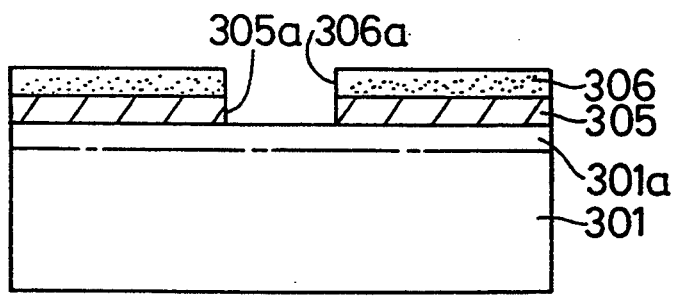
Figure 30:
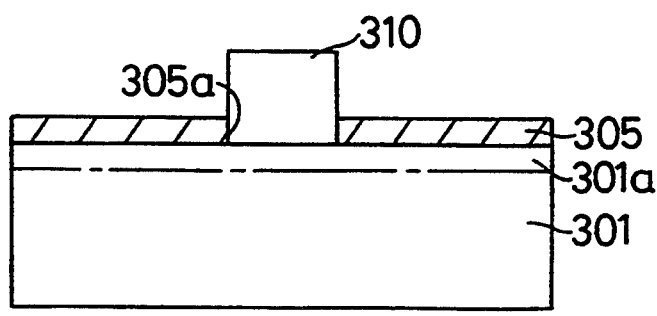

After forming the SiO film 121a, the thin Si layer 111, and the junction formation region 112 (FIG. 25(a)), the AR film 114 and the surface electrodes 10a and 10b are formed according to the same process steps as described with respect to FIGS. 2(c) and 2(d).

Thereafter, the structure of FIG. 25(b) is completely covered with the SiN film 710 except for a region on the rear surface of the substrate 109 where an aperture is to be formed, resulting in the sample 107a before the etching process (FIG. 25(c)).

Thereafter, the sample 107a is etched from the rear surface to form the aperture 109a (FIG. 25(d)), and the SiN film 710 and a portion of the SiO film 121a exposed in the aperture 109a are removed (FIG. 25(e)), completing the thin-film solar cell 101.

Also in this eleventh embodiment of the present invention, since the front and side surfaces of the sample 107a are completely covered with the SiN film 710 during the etching process, the complicated step of adhering the sample to the sample holder 132 using the wax can be dispensed with. In addition, the surface of the sample is not contaminated with the wax.

While in the above-described tenth and eleventh embodiments the surface electrodes comprise Ag and the AR film comprises SiN, the surface electrodes may be a two-layer structure comprising Ti/Ag and the AR film may be a two-layer structure comprising $TiO_2/MgF_2$.

Although the SiN film is employed as the protective coat against the etchant of KOH or the like, a metal film, such as Au, Ag, or Pt, may be employed. Alternatively, the protective coat may be a two-layer structure comprising two films appropriately selected from metal films, insulating films, and semiconductor films, for example, $SiO_2/Si_3N_4$, Ti/Ag, or $SiO_2$/Ag.

In the above-described eleventh embodiment, if the AR film comprises SiN and the protective coat 710 is a two-layer structure comprising a lower SiO film and an upper SiN film, since the SiO lower protective film is interposed between the SiN AR film and the SiN upper protective film, the SiN AR film is not adversely affected by the etching process for removing the protective film.

While in the above-described tenth and eleventh embodiments inexpensive MG-Si is employed as the material of the substrate through which the aperture is formed, the material of the substrate may be other semiconductors, ceramic, carbon, or metal. In addition, the semiconductor device subjected to the above-described rear surface etching process is not restricted to the thin-film solar cell.

What is claimed is:

1. A thin-film solar cell comprising:
   a thin active layer of high purity semiconductor material having a p-n junction and opposed front and rear surfaces for light-to-electricity conversion;
   a structure for supporting the thin active layer comprising a supporting substrate of a lower purity semiconductor material having a frame shape with a central opening and opposed front and rear surfaces, the rear surface of the active layer being disposed on the front surface of the supporting substrate, and an insulating barrier layer interposed between the front surface of the frame-shaped supporting substrate and the rear surface of the active layer for preventing impurities in the supporting substrate from diffusing into the active layer, the rear surface of the active layer being exposed within the opening of the frame-shaped supporting substrate; and
   a rear electrode disposed on the rear surface of the supporting substrate and contacting the rear surface of the active layer in the opening in the supporting substrate.

2. The thin-film solar cell of claim 1 wherein the supporting substrate comprises a plurality of stripe-shaped parts parallel to each other arranged inside the opening in the frame-shaped supporting substrate.

3. The thin-film solar cell of claim 1 wherein the supporting substrate comprises a lattice-shaped part arranged inside the opening in the frame-shaped supporting substrate.

4. The thin-film solar cell of claim 1 wherein the supporting substrate has a lattice shape with a plurality of openings exposing the rear surface of the active layer wherein the rear electrode contacts the rear surface of the active layer in the openings.

5. The thin-film solar cell of claim 1 wherein the supporting substrate includes a plurality of pillars disposed on the rear surface of the active layer spaced apart from each other.

6. The thin-film solar cell of claim 1 including a comb-shaped surface electrode disposed on the front surface of the active layer comprising a linear bus electrode and a plurality of grid electrodes protruding from opposite sides of the bus electrode for collecting photocurrent produced in the active layer and transferring the photocurrent to the bus electrode wherein said linear bus electrode is disposed on the front surface of the active layer opposite a linear part of the supporting substrate.

7. The thin-film solar cell of claim 1 wherein the rear electrode comprises a metal of high reflectance.

8. The thin-film solar cell of claim 7 including an anti-reflection film disposed on the front surface of the active layer for preventing incident light from being reflected from the active layer wherein the front surface of the active layer includes a plurality of projections increasing optical path length in the active layer of incident light.

9. The thin-film solar cell of claim 8 wherein the rear surface of the active layer includes a plurality of projections increasing the optical path length in the active layer of incident light reflected by the rear surface.

* * * * *